(12) United States Patent
Park et al.

(10) Patent No.: US 8,384,439 B2
(45) Date of Patent: Feb. 26, 2013

(54) SEMICONDUCTOR DEVICES AND METHODS OF FABRICATING THE SAME

(75) Inventors: Jae-chul Park, Seoul (KR); I-hun Song, Seongnam-si (KR); Young-soo Park, Yongin-si (KR); Kee-won Kwon, Suwon-si (KR); Chang-jung Kim, Yongin-si (KR); Kyoung-kook Kim, Suwon-si (KR); Sung-ho Park, Yongin-si (KR); Sung-hoon Lee, Yongin-si (KR); Sang-wook Kim, Yongin-si (KR); Sun-il Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 509 days.

(21) Appl. No.: 12/591,701

(22) Filed: Nov. 30, 2009

(65) Prior Publication Data

US 2010/0148825 A1    Jun. 17, 2010

(30) Foreign Application Priority Data

Nov. 28, 2008 (KR) .................. 10-2008-0119942
Apr. 30, 2009 (KR) .................. 10-2009-0038461

(51) Int. Cl.
*H01L 25/00* (2006.01)
*H03K 19/00* (2006.01)

(52) U.S. Cl. ......... 326/101; 326/102; 326/103; 326/121

(58) Field of Classification Search ......... None
See application file for complete search history.

(56) References Cited

U.S. PATENT DOCUMENTS

| 2007/0228471 A1* | 10/2007 | Schuele et al. ............... 257/350 |
| 2009/0072862 A1* | 3/2009 | Kurokawa .................... 326/112 |
| 2010/0090216 A1* | 4/2010 | Ferrao De Paiva Martins et al. .......................... 257/43 |

FOREIGN PATENT DOCUMENTS

| JP | 10-079516 | 3/1998 |
| JP | 2000-114540 | 4/2000 |
| JP | 2000-183356 | 6/2000 |
| JP | 2007-073560 | 3/2007 |
| KR | 10-2002-0091898 | 12/2002 |
| KR | 10-2006-0133834 | 12/2006 |
| KR | 10-2008-0020569 | 3/2008 |

* cited by examiner

*Primary Examiner* — Anh Tran
(74) *Attorney, Agent, or Firm* — Harness, Dickey & Pierce, P.L.C.

(57) ABSTRACT

Provided are a semiconductor device and a method of fabricating the semiconductor device. The semiconductor device may be a complementary device including a p-type oxide TFT and an n-type oxide TFT. The semiconductor device may be a logic device such as an inverter, a NAND device, or a NOR device.

28 Claims, 22 Drawing Sheets

SEMICONDUCTOR DEVICES AND METHODS OF FABRICATING THE SAME

CROSS-REFERENCE TO RELATED APPLICATIONS

This application claims priority under 35 U.S.C. §119 of Korean Patent Application Nos. 10-2008-0119942, filed on Nov. 28, 2008, and No. 10-2009-0038461, filed on Apr. 30, 2009, in the Korean Intellectual Property Office, the disclosures of which are incorporated herein in their entirety by reference.

BACKGROUND

1. Field

Example embodiments relate to semiconductor devices and methods of fabricating the semiconductor devices.

2. Description of the Related Art

Transistors are widely used as switching devices or driving devices in electronic appliances. Thin film transistors (TFTs) may be widely used in flat panel displays including liquid crystal displays (LCDs) or organic electroluminescence (EL) devices as the TFTs may be fabricated on a glass substrate or a plastic substrate.

To improve operating properties of a transistor, an oxide layer having a high carrier mobility, for example, a ZnO-based material layer, may be used as a channel layer. The above method may be applied to TFTs included in flat panel display apparatuses.

When a silicon layer is used as a channel layer, n-channel metal-oxide semiconductor (NMOS) transistors and p-channel metal-oxide semiconductor (PMOS) transistors may be fabricated by changing the kind of atoms doped in the channel layer, and accordingly, complementary metal oxide semiconductor (CMOS) devices may be realized. However, when the transistor has an oxide layer as the channel layer, it is relatively difficult to realize complementary devices.

SUMMARY

Example embodiments include a semiconductor device including at least two different oxide transistors.

Example embodiments include a method of fabricating the semiconductor device.

According to example embodiments, a semiconductor device includes: a first thin film transistor (TFT) including a first source, a first drain, a first channel layer, and a first gate; and a second TFT including a second source, a second drain, a second channel layer, and a second gate, and one of the first and second channel layers is a p-type oxide layer, and another of the first and second channel layers is an n-type oxide layer.

In an example embodiment, the first and second TFTs may have at least one of a bottom gate structure and a top gate structure.

In an example embodiment, one of the first and second TFTs may have a bottom gate structure, and a other of the first and second TFTs may have a top gate structure.

In an example embodiment, at least one of the first and second TFTs may have a dual gate structure which further includes an additional gate.

In an example embodiment, the first source and first drain may contact upper surfaces or lower surfaces at end portions of the first channel layer.

In an example embodiment, the second source and the second drain may contact upper surfaces or lower surfaces at end portions of the second channel layer.

In an example embodiment, the first source and the first drain may include a first material layer which contacts end portions of the first channel layer, the second source and the second drain may include a second material layer which contacts end portions of the second channel layer, and the first and second material layers may be different from each other.

In an example embodiment, the first material layer may contact upper surfaces at end portions of the first channel layer, and the second material layer may contact upper surfaces or lower surfaces at end portions of the second channel layer.

In an example embodiment, the first source and the first drain may have dual-layered structures, and the second source and the second drain may have single-layered structures or dual-layered structures.

In an example embodiment, the first drain and the second drain may contact each other to form a common drain.

In an example embodiment, the semiconductor device may be an inverter, a NAND device, a NOR device, an encoder, a decoder, a multiplexer (MUX), a de multiplexer (DEMUX), or a sense amplifier.

According to example embodiments, a method of fabricating a semiconductor device, which includes a first thin film transistor (TFT) having a first source, a first drain, a first channel layer, and a first gate; and a second TFT having a second source, a second drain, a second channel layer, and a second gate, the method including: forming the first channel layer on an under layer by using a first conductive type oxide material; and forming the second channel layer on the under layer to be separated from the first channel layer by using a second conductive type oxide material.

In an example embodiment, the forming of the second channel layer may include: forming a second channel material layer on the under layer and the first channel layer by using the second conductive type oxide material; and patterning the second channel material layer.

In an example embodiment, the forming of the second channel layer may include: forming a photoresist layer which covers the first channel layer and includes an opening exposing a region of the under layer separated from the first channel layer on the under layer; forming a second channel material layer on the exposed region of the under layer and on the photoresist layer by using the second conductive oxide material; and removing the photoresist layer and the second channel material layer disposed on the photoresist layer.

In an example embodiment, the method may further include: forming an electrode material layer which covers the first and second channel layers on the under layer; and patterning the electrode material layer to form the first source, the first drain, the second source, and the second drain.

In an example embodiment, the method may further include: forming a first material layer which covers the first channel layer on the under layer; forming a second material layer which covers the first material layer and the second channel layer on the under layer; and patterning the first and second material layers to form the first source, the first drain, the second source, and the second drain.

According to example embodiments, a method of fabricating a semiconductor device which includes a first thin film transistor (TFT) having a first source, a first drain, a first channel layer, and a first gate; and a second TFT having a second source, a second drain, a second channel layer, and a second gate, the method including: forming the first channel layer on an under layer using a first conductive type oxide material; forming a first electrode layer and a second electrode layer, the first electrode layer covering the first channel layer, the second electrode layer being separate from the first electrode layer on the under layer; forming the second channel layer which contacts the first and second electrode layers on the under layer between the first and second electrode layers using a second conductive type oxide material; and patterning the first electrode layer. The second electrode layer may be the second source, and the first electrode layer may be patterned to form the first source, the first drain, and the second drain.

In an example embodiment, the forming the first and second electrode layers may have single-layered structures.

In an example embodiment, the forming the first and second electrode layers may have multi-layered structures.

In an example embodiment, the forming the first and second electrode layers may have the same stack structure. Also, the forming the first and second electrode layers may have dual-layered structures.

In an example embodiment, the first gate may be formed at least one of above and under the first channel layer, and the second gate may be formed at least one of above and under the second channel layer.

In an example embodiment, at least one of the first and second TFTs may have a dual-gate structure which may include an additional gate.

According to example embodiments, a NAND device includes: a first transistor and a second transistor connected to a power source in parallel; and a third transistor and a fourth transistor connected to a drain of the first and second transistors in series. The first and second transistors are p-type oxide transistors, and the third and fourth transistors are n-type oxide transistors.

In an example embodiment, the third and fourth transistors may share an n-type oxide channel layer, a connection wire may contact the n-type oxide channel layer between a gate of the third transistor and a gate of the fourth transistor, and the connection wire may be connected to at least one of the gate of the third transistor and the gate of the fourth transistor.

In an example embodiment, the third and fourth transistors may share an n-type oxide channel layer, and a doping concentration of the n-type oxide channel layer between a gate of the third transistor and a gate of the fourth transistor may be higher than a doping concentration of a remaining region of the n-type oxide channel layer.

According to example embodiments, a NOR device includes: a first transistor and a second transistor connected to a power source in parallel; and a third transistor and a fourth transistor connected to a drain of the first and second transistors in series. The first and second transistors are n-type oxide transistors, and the third and fourth transistors are p-type oxide transistors.

In an example embodiment, the third and fourth transistors may share a p-type oxide channel layer, a connection wire may contact the p-type oxide channel layer between a gate of the third transistor and a gate of the fourth transistor. The connection wire may be connected to at least one of the gate of the third transistor and the gate of the fourth transistor.

In an example embodiment, a doping concentration of the p-type oxide channel layer between a gate of the third transistor and a gate of the fourth transistor may be higher than a doping concentration of a remaining region of the p-type oxide channel layer.

BRIEF DESCRIPTION OF THE DRAWINGS

The above and/or other aspects of example embodiments may become more apparent and readily appreciated when the following description, is taken in conjunction with the accompanying drawings of which

DETAILED DESCRIPTION

Figure 1:
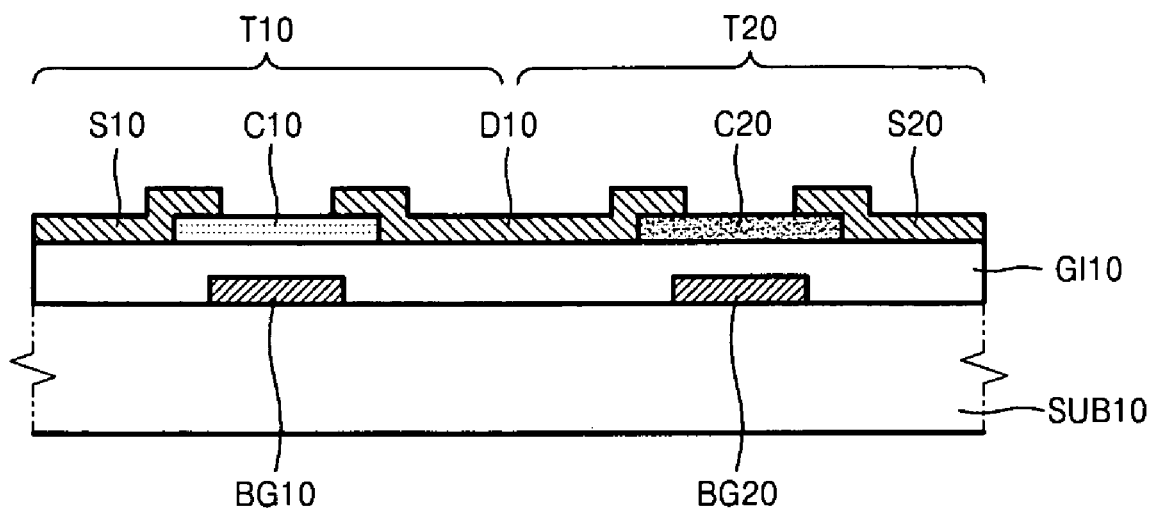
FIGS. 1 through 4 are cross-sectional views of semiconductor devices according to example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

FIGS. 1 through 4 are cross-sectional views of semiconductor devices according to example embodiments.

Referring to FIG. 1, a first bottom gate BG10 and a second bottom gate BG20 may be formed on a substrate SUB10, and a gate insulating layer GI10 may cover the first and second bottom gates BG10 and BG20. A first oxide channel layer C10 and a second oxide channel layer C20 may be disposed on the gate insulating layer GI10. The first oxide channel layer C10 may be located above the first bottom gate BG10, and the second oxide channel layer C20 may be located above the second bottom gate BG20. One of the first and second oxide channel layers C10 and C20 may be a p-type oxide layer, and the other may be an n-type oxide layer. The p-type oxide layer may include at least one of nickel (Ni) oxide, niobium (Nb) oxide, copper (Cu) oxide, Cu oxide doped with α (for example, α is boron, aluminum, gallium, or indium), strontium-copper (SrCu) oxide, lanthanum-copper (LaCu) oxide doped with β (for example, β is sulfur or selenium), and lead sulfide (PbS) oxide. The n-type oxide layer may be a zinc-oxide (ZnO)-based oxide layer, and may further include indium (In), or indium (In) and gallium (Ga), or a IV-group element such as tin (Sn) or other elements. The first and second oxide channel layers C10 and C20 may be formed of the oxide as described above, and accordingly, they may be fabricated with relative ease by using a low temperature process.

A first source electrode S10, a common drain electrode D10, and a second source electrode S20 may be disposed on the gate insulating layer GI10. The first source electrode S10 may contact a first end of the first oxide channel layer C10, the common drain electrode D10 may contact a second end of the first oxide channel layer C10 and a first end of the second oxide channel layer C20, and the second source electrode S20 may contact a second end of the second oxide channel layer C20. The common drain electrode D10 may be divided into a first drain electrode which contacts the second end of the first oxide channel layer C10 and a second drain electrode which contacts the first end of the second oxide channel layer C20. Although it is not shown in the drawings, a passivation layer which covers the first and second oxide channel layers C10 and C20, the first and second source electrodes S10 and S20, and the common drain electrode D10 may be formed on the gate insulating layer GI10. The passivation layer may be formed as an insulating layer such as a silicon oxide layer or a silicon nitride layer.

In FIG. 1, the first bottom gate BG10, the gate insulating layer GI10, the first oxide channel layer C10, the first source electrode S10, and the common drain electrode D10 may form a first transistor T10. Also, the second bottom gate BG20, the gate insulating layer GI10, the second oxide channel layer C20, the second source electrode S20, and the common drain electrode D10 may form a second transistor T20. One of the first and second transistors T10 and T20 may be a p-channel transistor and the other may be an n-channel transistor. Accordingly, for example, the semiconductor device of the present embodiment may be a complementary device.

In FIG. 1, the first source electrode S10, the common drain electrode D10, and the second source electrode S20 may be formed on the first and second oxide channel layers C10 and C20. However, locations of the layers may be changed. A modified example is shown in FIG. 2.

Figure 2:
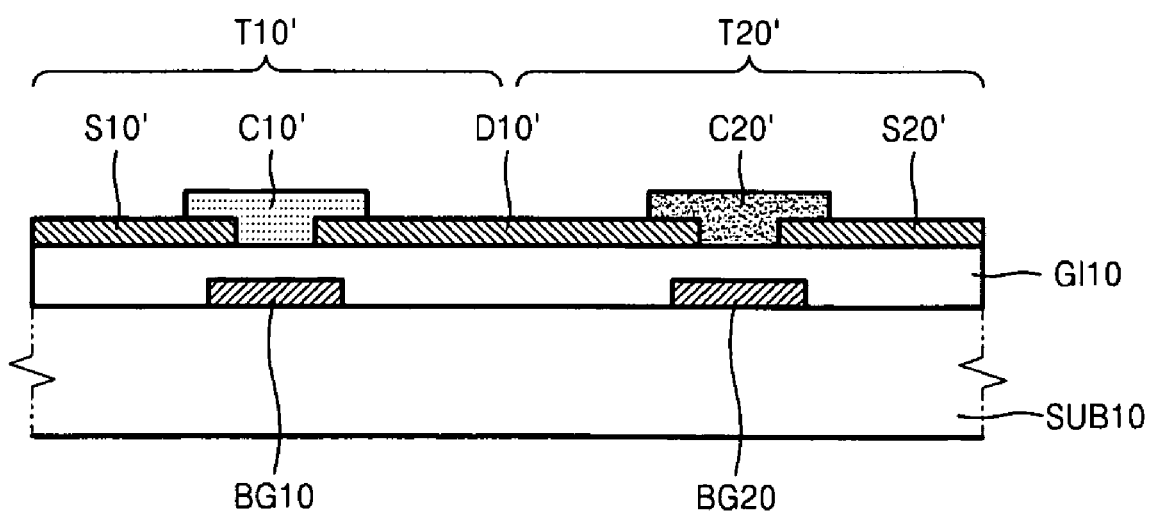

Referring to FIG. 2, a first source electrode S10', a common drain electrode D10', and a second source electrode S20', which are separated from each other, may be formed on the gate insulating layer GI10. A first oxide channel layer C10' which contacts the first source electrode S10' and the common drain electrode D10' may be disposed on the gate insulating layer GI10 between the two electrodes S10' and D10'. Also, a second oxide channel layer C20' which contacts the common drain electrode D10' and the second source electrode S20' may be disposed on the gate insulating layer GI10 between the two electrodes D10' and S20'. The first and second oxide channel layers C10' and C20' may correspond to the first and second bottom gates BG10 and BG20, respectively. Moreover, the first and second oxide channel layers C10' and C20' may be formed of the same material as that forming the first and second oxide channel layers C10 and C20.

Figure 3:
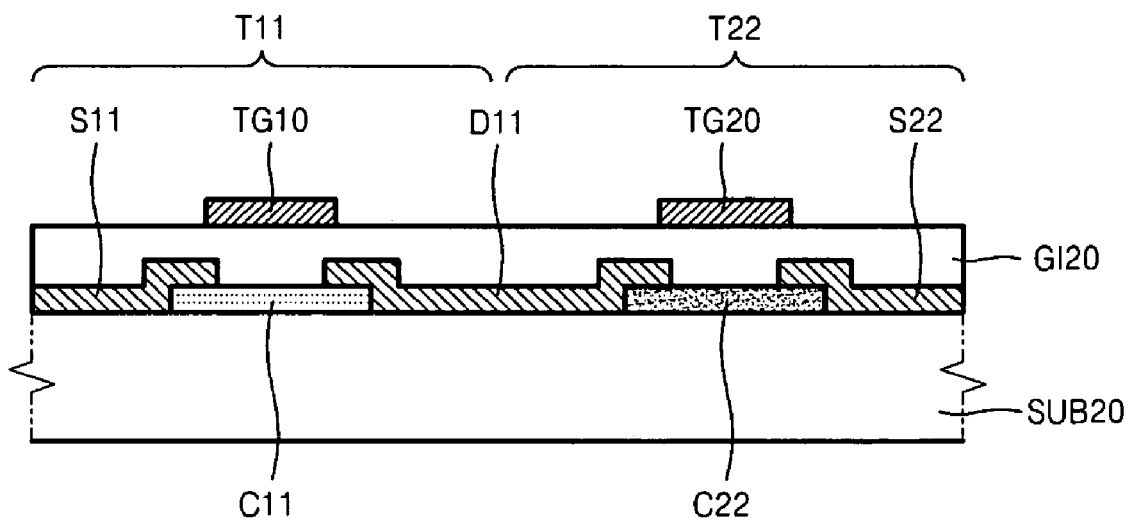
Figure 4:
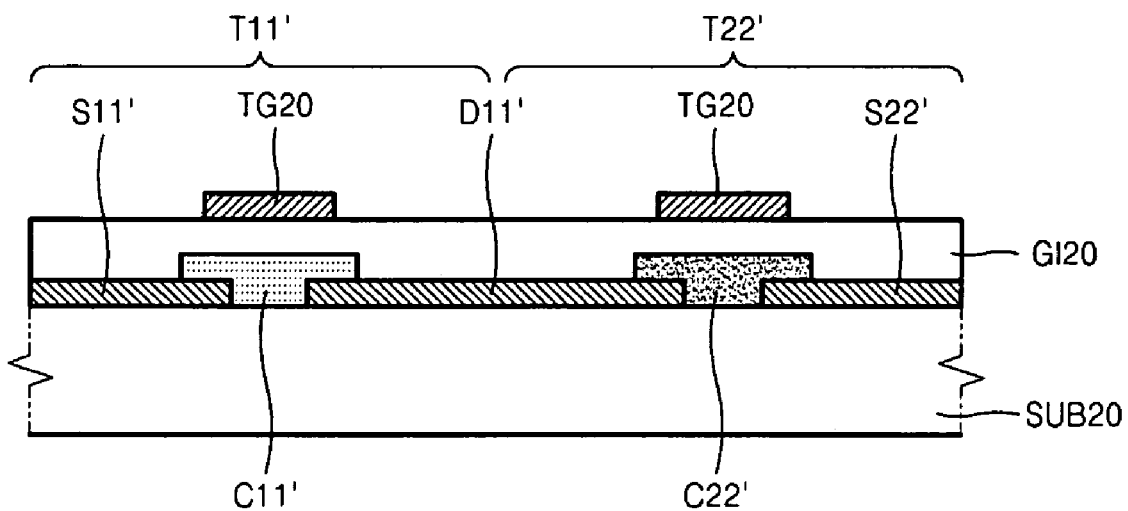

In FIGS. 1 and 2, transistors T10, T10', T20, and T20' have bottom gate structures. However, the transistor may have a top gate structure in example embodiments. FIGS. 3 and 4 illustrate semiconductor devices having transistors with top gate structures.

Referring to FIG. 3, a first oxide channel layer C11 and a second oxide channel layer C22, which are separated from each other, may be disposed on a substrate SUB20. A first source electrode S11 and a common drain electrode D11 may contact both ends of the first oxide channel layer C11. The common drain electrode D11 may extend to contact an end of the second oxide channel layer C22. A second source electrode S22 may contact another end of the second oxide channel layer C22. A gate insulating layer GI20 (which covers the first and second oxide channel layer C11 and C22), the first and second source electrodes S11 and S22, and the common drain electrode D11 may be disposed on the substrate SUB20. A first top gate TG10 and a second top gate TG20 may be disposed on the gate insulating layer GI20. The first top gate TG10 may be located above the first oxide channel layer C11, and the second top gate TG20 may be located above the second oxide channel layer C22.

Locations of the first and second oxide channel layers C11 and C22, the first source electrode S11, the common drain electrode D11 and the second source electrode S22 shown in FIG. 3 may be modified as shown in FIG. 4.

Referring to FIG. 4, a first source electrode S11', a common drain electrode D11', and a second source electrode S22' may contact bottom surfaces of both ends of the first and second oxide channel layers C11' and C22'. The structure of these layers may be somewhat similar to that illustrated in FIG. 2.

In FIGS. 2 through 4, reference numerals T10', T11, and T11' denote the first transistors, and reference numerals T20', T22, and T22' denote the second transistors. One of the first transistor T10', T11, or T11' and the second transistor T20', T22, or T22' may be a p-type oxide thin film transistor (TFT), and the other may be an n-type oxide TFT. Accordingly, for example, the semiconductor device of the present embodiment may be a complementary device like the semiconductor device illustrated in FIG. 1.

FIGS. 5 through 8 are plan views of the semiconductor devices illustrated in FIGS. 1 through 4.

Figure 5:
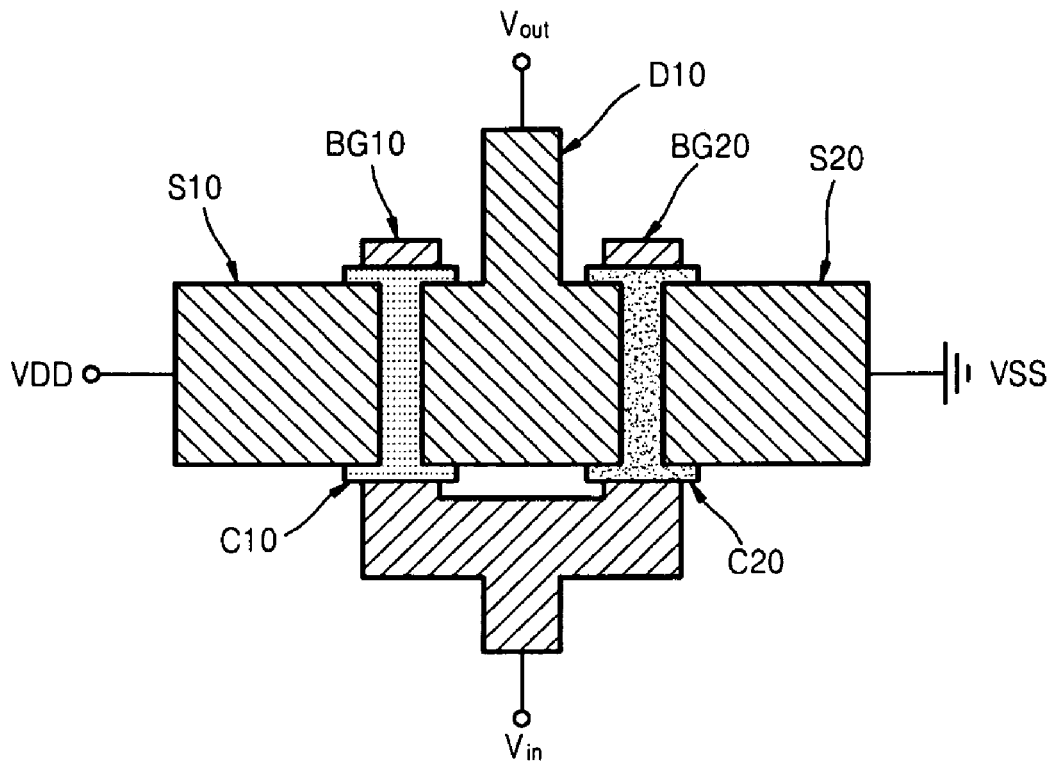
FIGS. 5 through 8 are plan views of the semiconductor devices illustrated in FIGS. 1 through 4.
Figure 6:
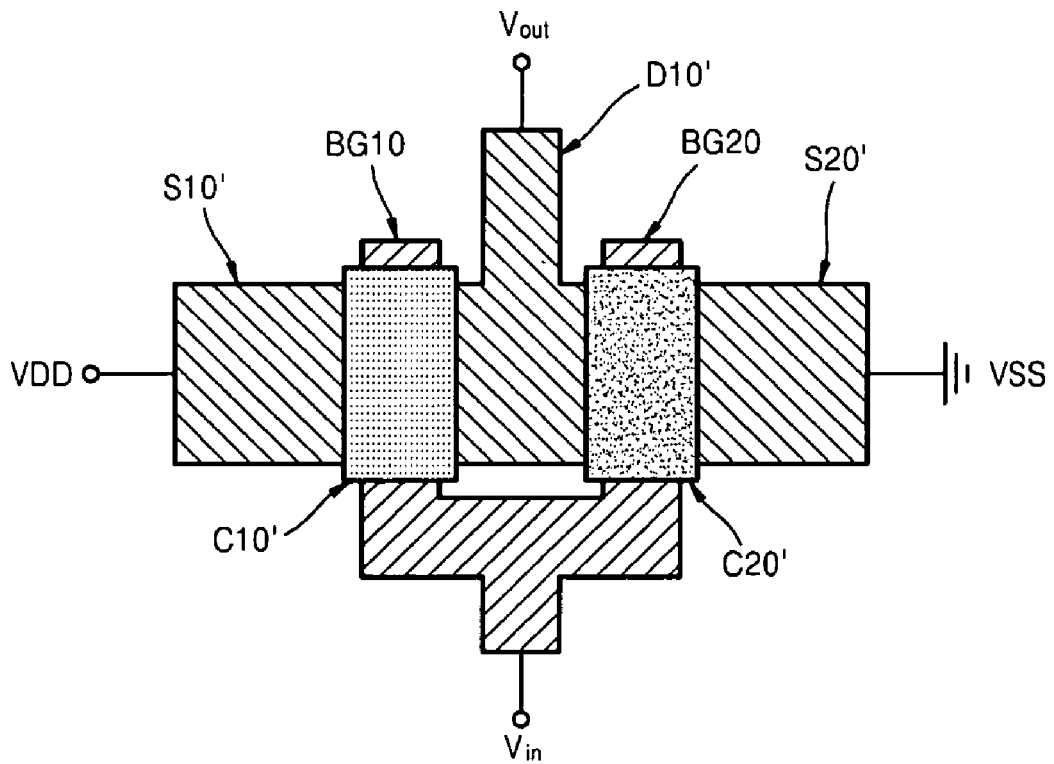

Referring to FIGS. 5 and 6, the first bottom gate BG10 and the second bottom gate BG20 may be connected to each other. Also, for example, the first top gate TG10 and the second top gate TG20 shown in FIGS. 7 and 8 may be connected to each other. The structures shown in FIGS. 5 through 8 may be modified in various ways.

The semiconductor devices shown in FIGS. 5 through 8 may be inverters. For example, components of the semiconductor devices of FIGS. 5 through 8 and connections between terminals VDD, Vin, Vout, and VSS are shown in the drawings. For example, the first oxide channel layers C10, C10', C11, and C11' are p-type oxide layers, and the second oxide channel layers C20, C20', C22, and C22' are n-type oxide layers.

Referring to FIG. 5, the first and second bottom gates BG10 and BG20 may be connected to an input terminal Vin, and the first source electrode S10 may be connected to a power terminal VDD. The common drain electrode D10 may be connected to an output terminal Vout, and the second source electrode S20 may be connected to a ground terminal VSS. The connection relations are somewhat similarly shown in the semiconductor devices of FIGS. 6 through 8. When the first oxide channel layers C10, C10', C11, and C11' are n-type oxide layers and the second oxide channel layers C20, C20', C22, and C22' are p-type oxide layers, the first source electrodes S10, S10', S11, and S11' may be connected to the ground terminal VSS and the second source electrodes S20, S20', S22, and S22' may be connected to the power terminal VDD in FIGS. 5 through 8.

Because the semiconductor devices of FIGS. 5 through 8 are complementary inverters, the semiconductor devices of FIGS. 5 through 8 may have excellent characteristics when compared with enhancement/enhancement (E/E) mode inverters or enhancement/depletion (E/D) mode inverters having two n-type oxide TFTs. For example, the current consumption of the complementary inverter according to example embodiments illustrated in FIGS. 5 through 8 may be relatively much smaller than those of the E/E mode and E/D mode inverters.

Figure 7:
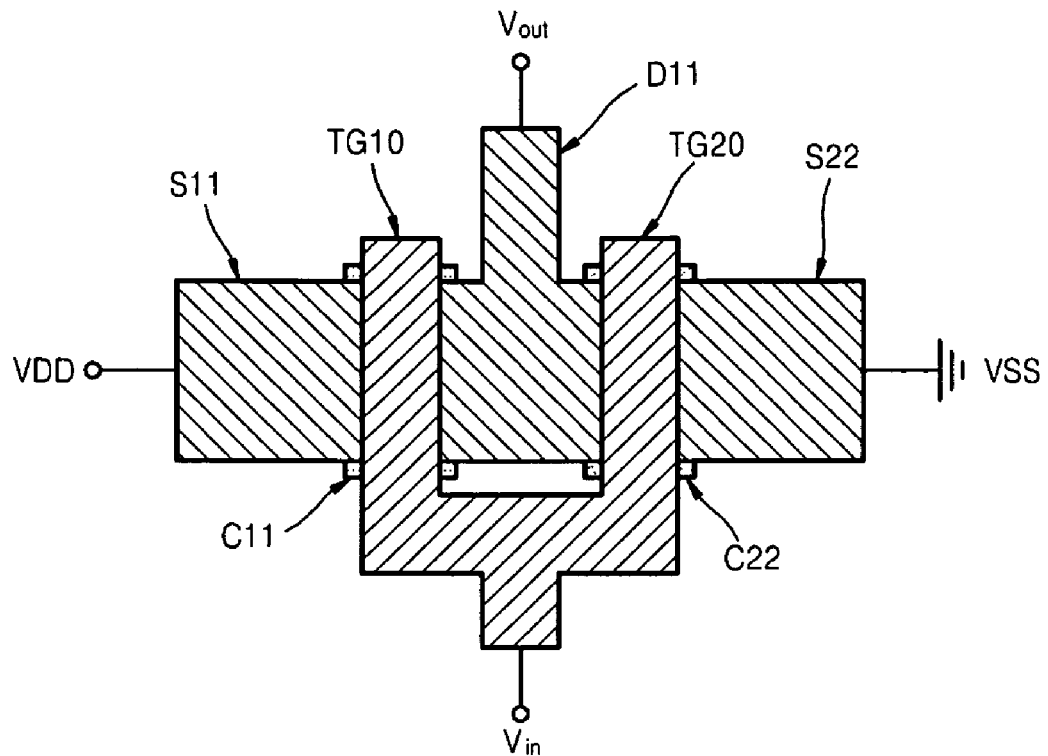
Figure 8:
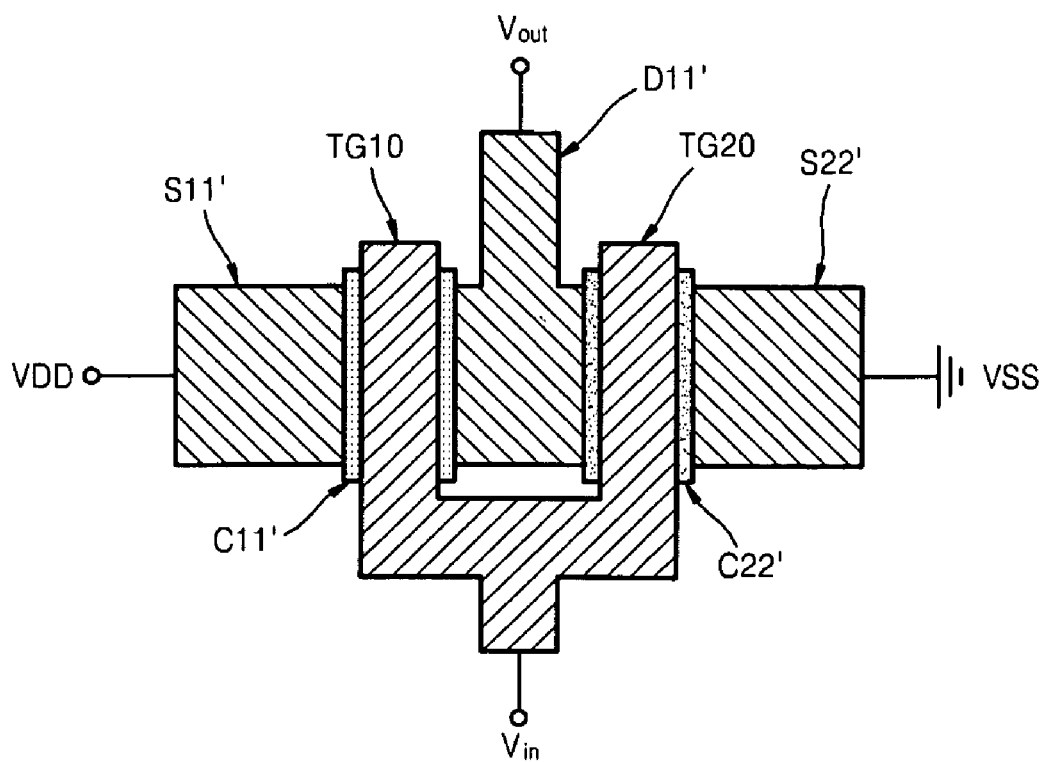
Figure 9:
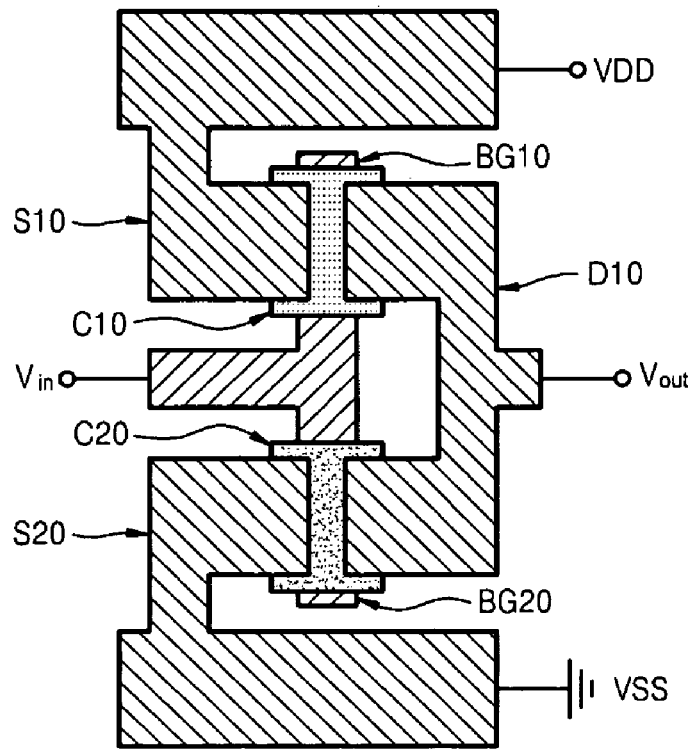
FIGS. 9 and 10 show modified examples of the semiconductor devices illustrated in FIGS. 5 and 7.
Figure 10:
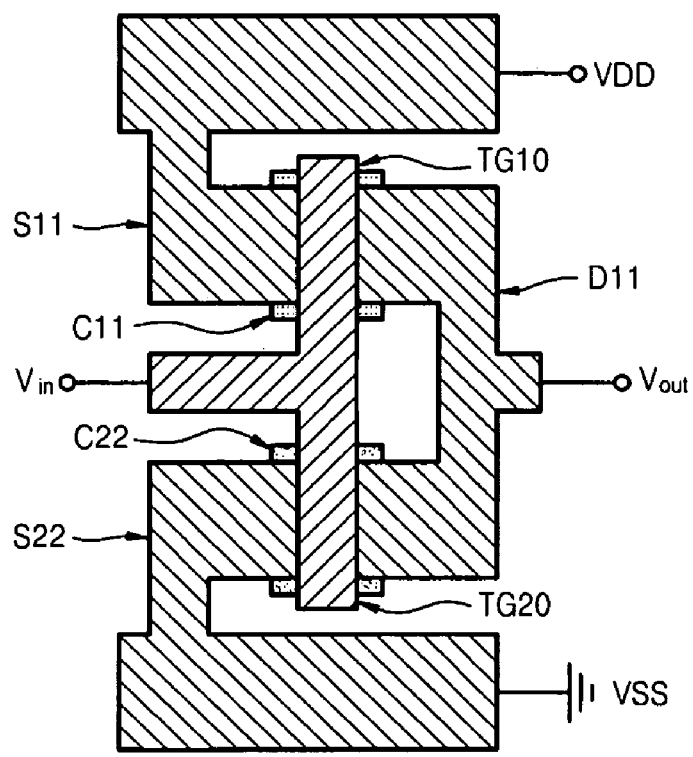

FIGS. 9 and 10 show modified examples of the semiconductor devices shown in FIGS. 5 and 7. The semiconductor device of FIG. 6 may be modified like the semiconductor device of FIG. 5 modified to the structure shown in FIG. 9, and the semiconductor device of FIG. 8 may be modified like the semiconductor device of FIG. 7 is modified to the structure shown in FIG. 10. The semiconductor devices according to example embodiments which will be described later may also be modified.

Figure 11:
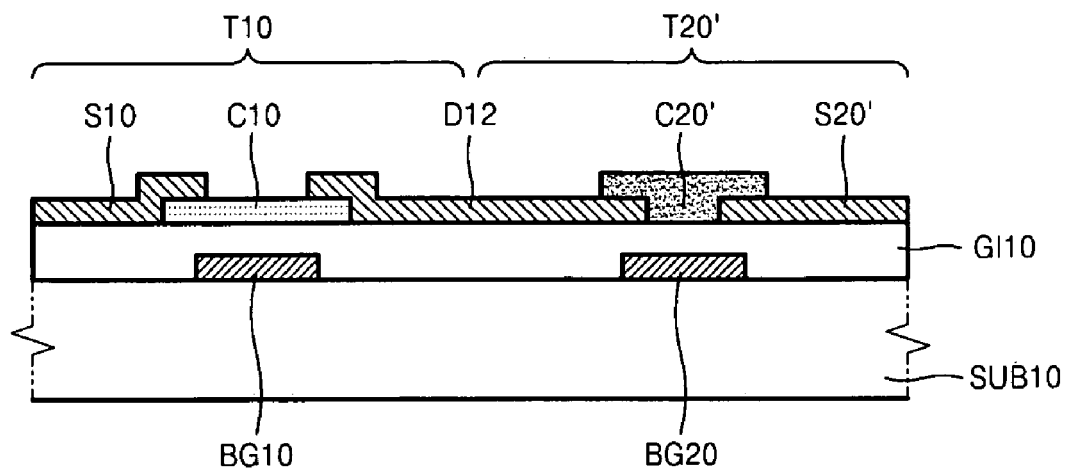
FIGS. 11 and 12 are cross-sectional views of semiconductor devices according to example embodiments.

FIG. 11 is a cross-sectional view of a semiconductor device according to example embodiments.

Referring to FIG. 11, the first transistor T10 may be the same as the first transistor T10 of FIG. 1, and the second transistor T20' may be the same as the second transistor T20' of FIG. 2. A common drain electrode D12 is disposed between the first and second transistors T10 and T20'.

Figure 12:
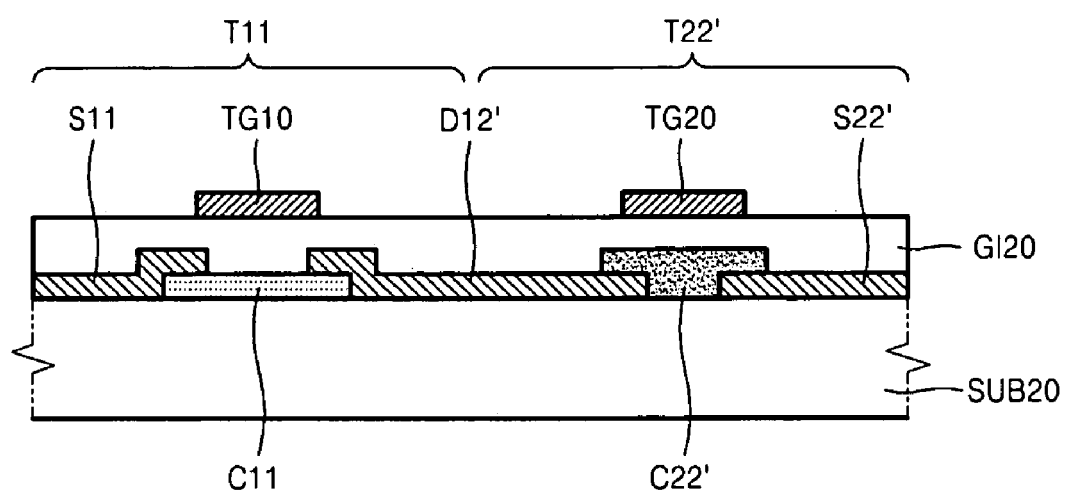

FIG. 12 is a cross-sectional view of a semiconductor device according to example embodiments.

Referring to FIG. 12, the first transistor T11 may be the same as the first transistor T11 of FIG. 3, and the second transistor T22' may be the same as the second transistor T22' of FIG. 4. A common drain electrode D12' is disposed between the first and second transistors T11 and T22'.

The source and drain electrodes of the first transistors T10 and T11 shown in FIGS. 11 and 12 contact upper surfaces of a corresponding channel layer, for example, C10 and C11, and the source and drain electrodes of the second transistors T20' and T22' may contact lower surfaces at both ends of a corresponding channel layer, for example, C20' and C22'.

Figure 13:
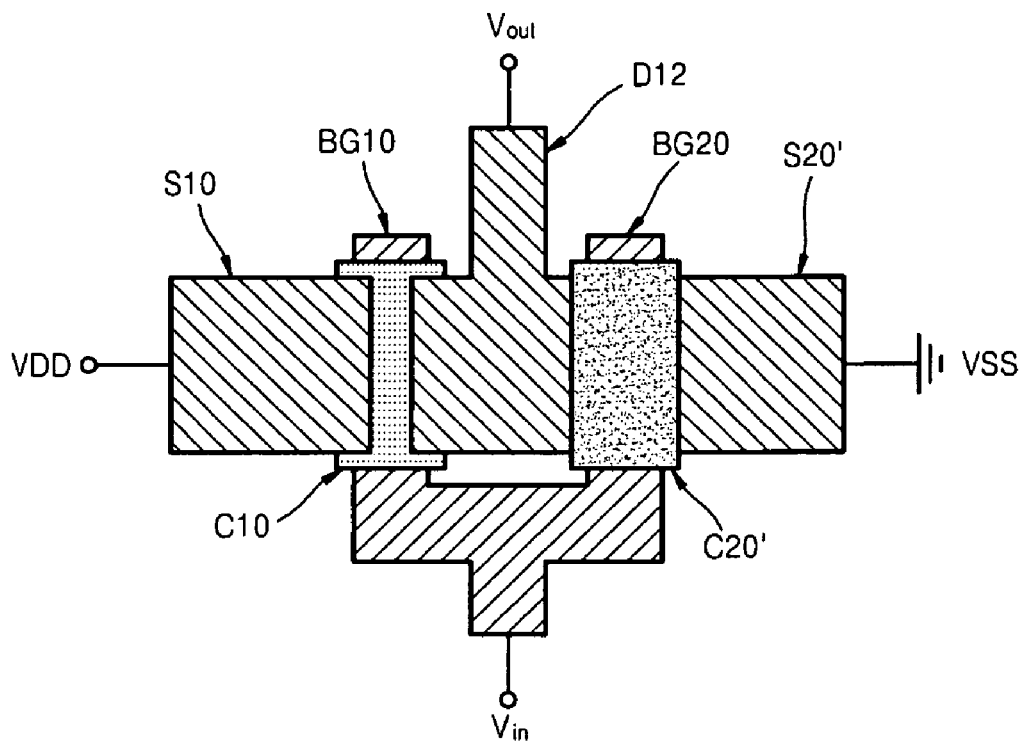
FIGS. 13 and 14 are plan views of the semiconductor devices illustrated in FIGS. 11 and 12.
Figure 14:
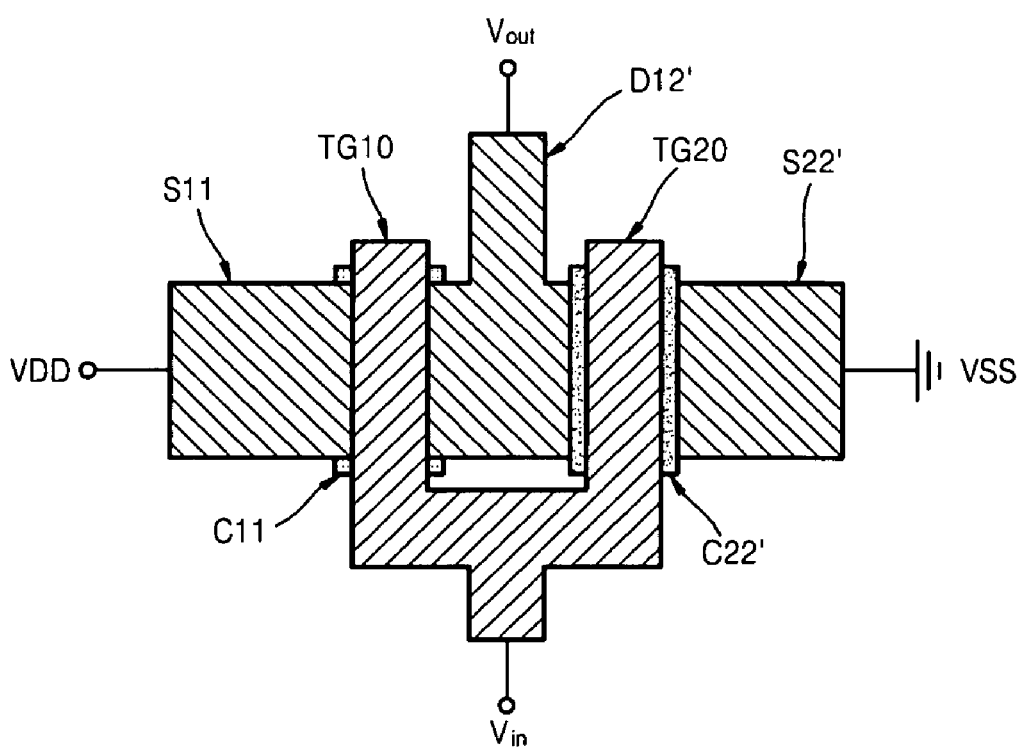

FIGS. 13 and 14 are plan views of the semiconductor devices shown in FIGS. 11 and 12.

The semiconductor devices shown in FIGS. 13 and 14 may be inverters, and for example, components of the semiconductor devices of FIGS. 13 and 14 and connections between terminals VDD, Vin, Vout, and VSS are shown in the drawings. Accordingly, the connections may be somewhat similar to those of FIGS. 5 through 8.

Figure 15:
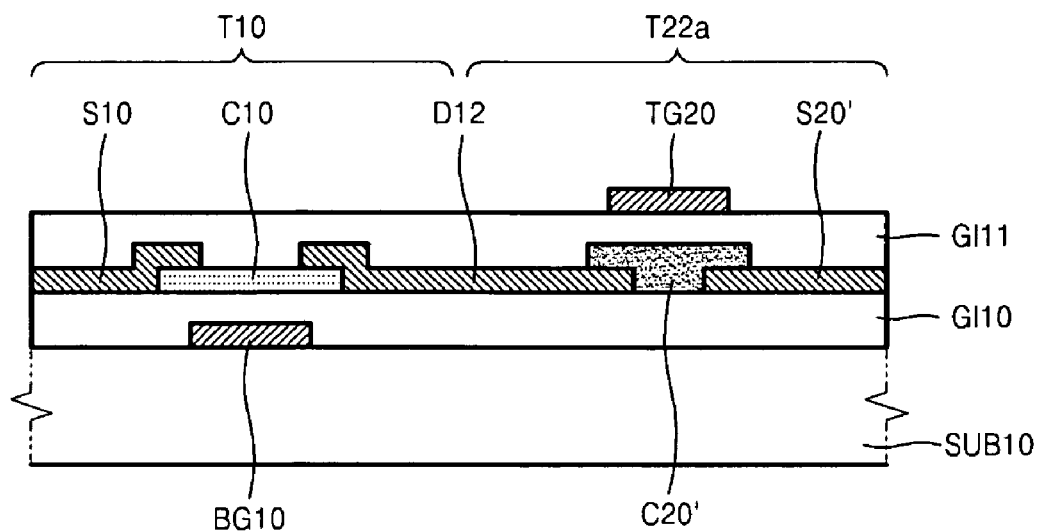
FIGS. 15 through 19 are cross-sectional views of semiconductor devices according to example embodiments.

FIG. 15 is a semiconductor device according to example embodiments. The semiconductor device shown in FIG. 15 is modified from the semiconductor device illustrated in FIG. 11. In more detail, in the semiconductor device illustrated in FIG. 15, the second transistor T20' of FIG. 11 has a top gate structure.

Referring to FIG. 15, a second transistor T22a may include a second top gate TG20 which is disposed above the second oxide channel layer C20'. A second gate insulating layer GI11 may be disposed between the second oxide channel layer C20' and the second top gate TG20.

Figure 16:
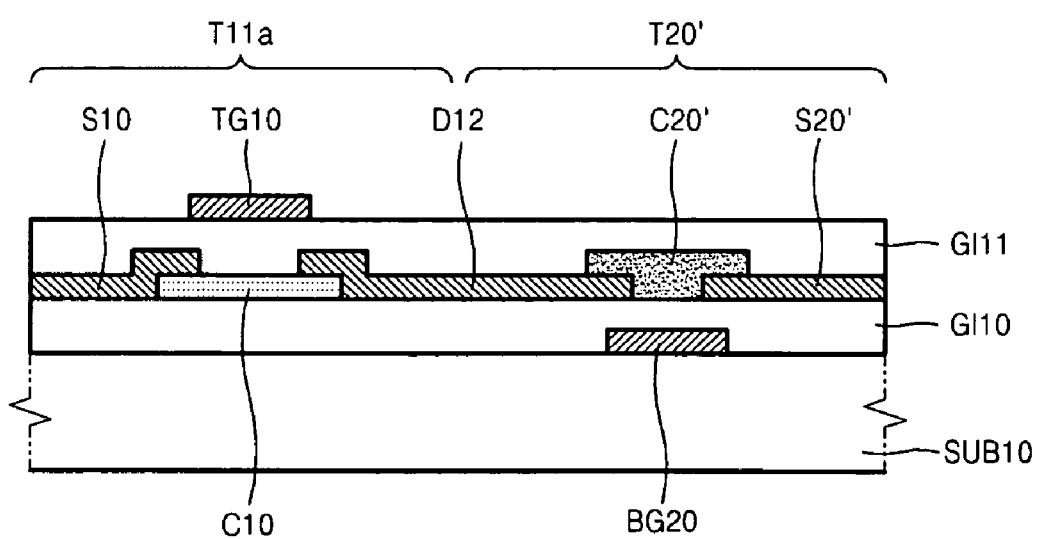

FIG. 16 is a cross-sectional view of a semiconductor device according to example embodiments. The semiconductor device shown in FIG. 16 is modified from the semiconductor device of FIG. 11. For example, the first transistor T10 of FIG. 11 is modified to have a top gate structure.

Referring to FIG. 16, a first transistor T11a may include a first top gate TG10 disposed above the first oxide channel layer C10. A second gate insulating layer GI11 may be disposed between the first oxide channel layer C10 and the first top gate TG10.

Figure 17:
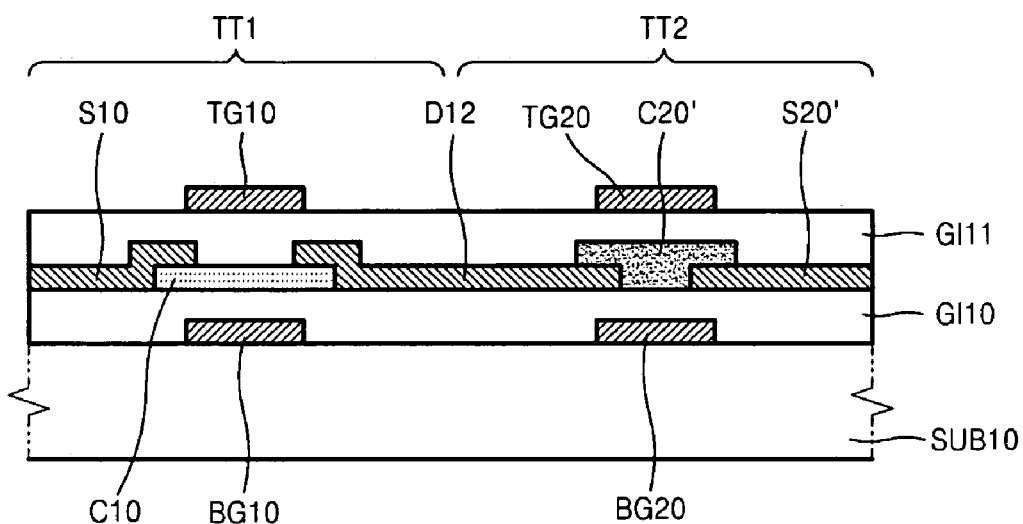

At least one of the two transistors in each of the semiconductor devices illustrated in FIGS. 1 through 16 may have a dual-gate structure. An example of the transistor having the dual-gate structure is shown in FIG. 17. The semiconductor device of FIG. 17 is modified from the semiconductor device shown as in FIG. 15.

Referring to FIG. 17, a first transistor TT1 and a second transistor TT2 may have a dual-gate structure. The first transistor TT1 may have a structure in which a first top gate TG10 is added to the structure of the first transistor T10 as shown in FIG. 15. The second transistor TT2 may have a structure in which a second bottom gate BG20 is added to the structure of the second transistor T22a as shown in FIG. 15.

Figure 18:
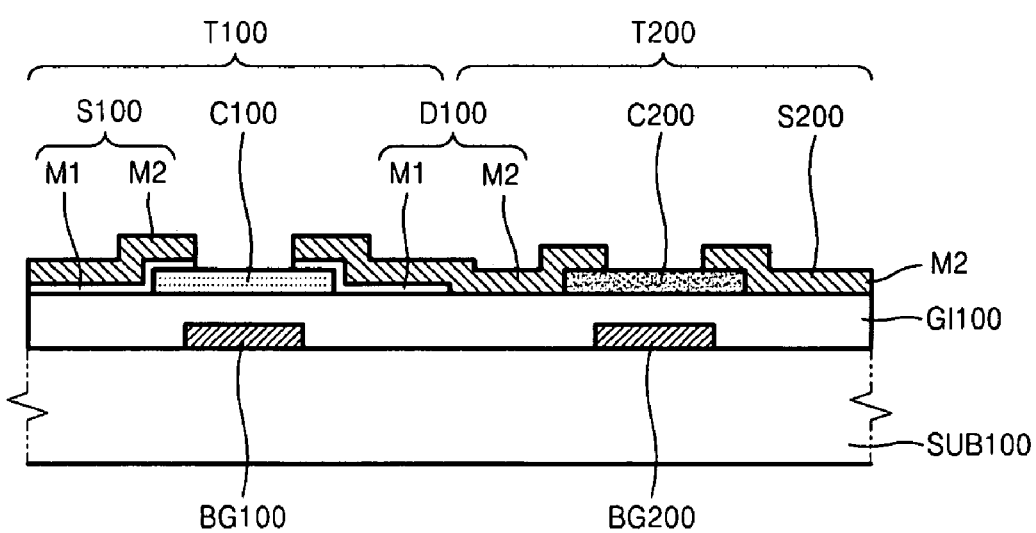

FIG. 18 is a cross-sectional view of a semiconductor device according to example embodiments.

Referring to FIG. 18, a first bottom gate BG100 and a second bottom gate BG200 may be disposed on a substrate SUB100, and a gate insulating layer GI100 which covers the first and second bottom gates BG100 and BG200 may be disposed. A first oxide channel layer C100 and a second oxide channel layer C200 may be disposed on the gate insulating layer GI100. The first and second oxide channel layer C100 and C200 may respectively correspond to the first and second oxide channel layers C10 and C20 shown in FIG. 1, and may be located above the first and second bottom gates BG100 and BG200. A first material layer M1 which contacts both ends of the first oxide channel layer C100 may be disposed on the gate insulating layer GI100. A second material layer M2 which contacts both ends of the second oxide channel layer C200 may be disposed. The second material layer M2 may be disposed on the first material layer M1. The first and second material layers M1 and M2 contacting an end of the first oxide channel layer C100 may form a first source electrode S100, and the first material layer M1 at the other end of the first oxide channel layer C100 and the second material layer M2 extending from the upper portion of the first material layer M1 to an end of the second oxide channel layer C200 may form a common drain electrode D100. The second material layer M2 located at the other end of the second oxide channel layer C200 may be a second source electrode S200. Reference numerals T100 and T200 denote first and second transistors. As described above, for example, an electrode material (the first material layer M1) contacting the first oxide channel layer C100 and an electrode material (the second material layer M2) contacting the second oxide channel layer C200 may be different from each other.

In FIG. 18, the common drain electrode D100 may be divided into two drain electrodes. For example, the common drain electrode D100 may be divided into a first drain electrode located in the first transistor T100 and a second drain electrode located in the second transistor T200. Also, the first drain electrode may include a dual-layered structure having the first material layer M1 and the second material layer M2, and the second drain electrode may have a single-layered structure having the second material layer M2. The first and second drain electrodes contact each other to form the common drain electrode D100.

Figure 19:
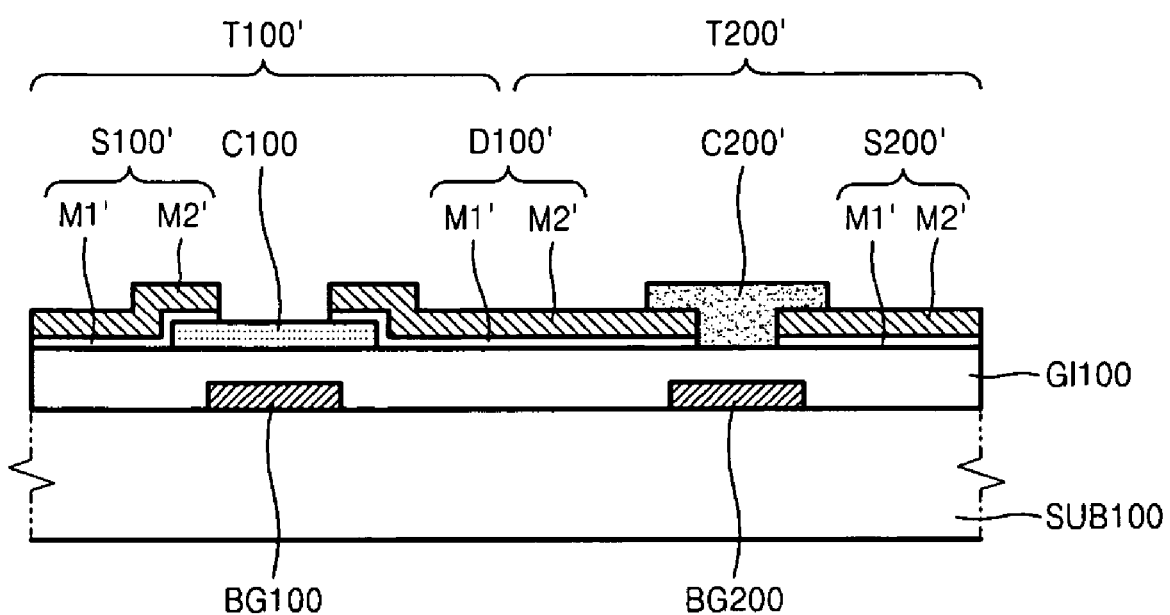

FIG. 19 is a cross-sectional view of a semiconductor device according to example embodiments.

Referring to FIG. 19, a structure including layers from the substrate 100 to the gate insulating layer GI100 may be the same as that of FIG. 18. The first oxide channel layer C100 may be disposed on the gate insulating layer GI100 above the first bottom gate BG100. A first source electrode S100' and a common drain electrode D100' which contact both ends of the upper surface of the first oxide channel layer C100 may be disposed on the gate insulating layer GI100. The common drain electrode D100' may extend to an upper portion of an end of the second bottom gate BG200. A second source electrode S200' may be disposed spaced apart from the common drain electrode D100'. A second channel layer C200' may be disposed on the gate insulating layer GI100 between the common drain electrode D100' and the second source electrode S200', for example, on the gate insulating layer GI100 above the second bottom gate BG200. Lower surfaces of both ends of the second oxide channel layer C200' may contact the common drain electrode D100' and the second source electrode S200'. The first source electrode S100', the common drain electrode D100', and the second source electrode S200' may have a multi-layered structure in which at least two material layers are stacked. For example, the first source electrode S100', the common drain electrode D100', and the second electrode S200' may have a dual-layered structure, in which the first and second material layers M1' and M2' are stacked. Therefore, for example, upper surfaces of both ends of the first oxide channel layer C100 may contact the first material layer M1', and lower surfaces of both ends of the second oxide channel layer C200' may contact the second material layer M2'. Reference numerals T100' and T200' denote first and second transistors. In some instances, for example, the second material layer M2' may not be disposed in the first transistor T100' region, and the first material layer M1' may not be disposed in the second transistor T200' region.

Structures of the semiconductor devices shown in FIGS. 18 and 19 may be modified in various ways. For example, at least one of the two transistors in each of the semiconductor devices of FIGS. 18 and 19 may be modified to have the top gate structure or the dual gate structure.

Figure 20A:
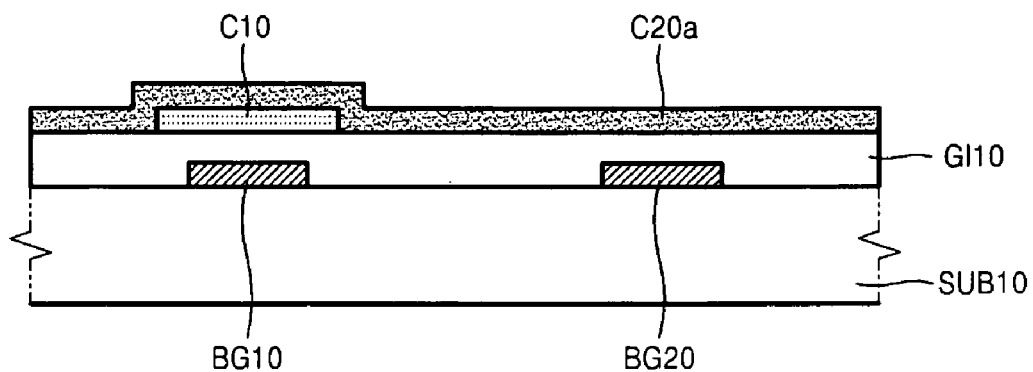
FIGS. 20A through 20C are cross-sectional views illustrating a method of fabricating a semiconductor device according to example embodiments.
Figure 20B:
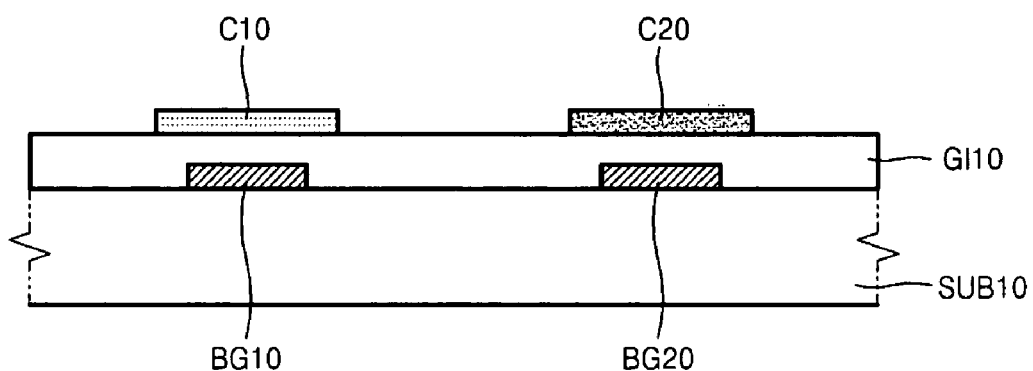
Figure 20C:
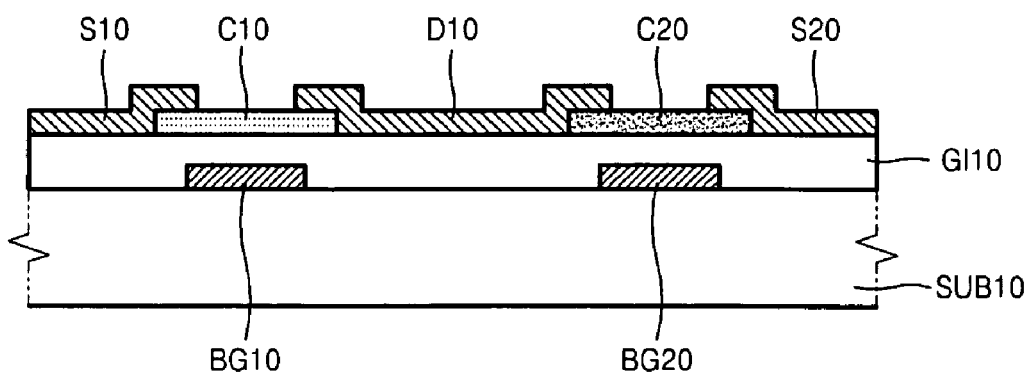

FIGS. 20A through 20C are cross-sectional views illustrating processes of fabricating a semiconductor device according to example embodiments.

Referring to FIG. 20A, the first and second bottom gates BG10 and BG20 are formed on the substrate SUB10, and the gate insulating layer GI10 which covers the first and second bottom gates BG10 and BG20 may be formed. The first oxide channel layer C10 of a first conductive type may be formed on the gate insulating layer GI10 above the first bottom gate BG10. A second oxide channel material layer C20a of a second conductive type which covers the first oxide channel layer C10 may be formed on the gate insulating layer GI10.

As shown in FIG. 20B, the second oxide channel layer C20 may be formed above the second bottom gate BG20 by patterning the second oxide channel material layer C20a. When patterning the second oxide channel material layer C20a, the first oxide channel layer C10 may not be damaged. For example, the fabrication method of the present embodiment may be applied to a case in which there is an etch selectivity between the material forming the first oxide channel layer C10 and the material forming the second oxide channel layer C20. The material forming the first oxide channel layer C10 and the material forming the second oxide channel layer C20 are described with reference to FIG. 1. However, the method of example embodiments may be applied to the case in which the two materials have etch selectivity.

Referring to FIG. 20C, the first source electrode S10, the common drain electrode D10, and the second source electrode S20 may be formed on the gate insulating layer GI10. The first source electrode S10 and the common drain electrode D10 may contact both ends of the first oxide channel layer C10. The common drain electrode D10 may extend to contact an end of the second oxide channel layer C20. The second source electrode S20 may contact another end of the second oxide channel layer C20. Although it is not shown in the drawings, for example, a passivation layer which covers the first and second oxide channel layers C10 and C20, the first and second source electrodes S10 and S20, and the common drain electrode D10 may be further formed on the gate insulating layer GI10. The passivation layer may be an insulating layer such as a silicon oxide layer or a silicon nitride layer. The substrate on which the above layers are formed may be annealed at a given temperature. For instance, the fabrication method of example embodiments may be to fabricate the semiconductor device illustrated in FIG. 1.

When the material forming the p-type oxide channel layer and the material forming the n-type oxide channel layer have etch selectivity, the semiconductor devices illustrated in FIGS. 2 through 4 may be fabricated by a method somewhat similar to the method illustrated in FIGS. 20A through 20C. For example, the semiconductor device shown in FIG. 2 may be fabricated by forming the first source electrode S10', the common drain electrode D10', and the second source electrode S20' on the gate insulating layer GI10, forming the first oxide channel layer C10' which contacts the first source electrode S10' and the common drain electrode D10', and forming the second oxide layer C20' which contacts the common drain electrode D10' and the second source electrode S20'.

Figure 21:
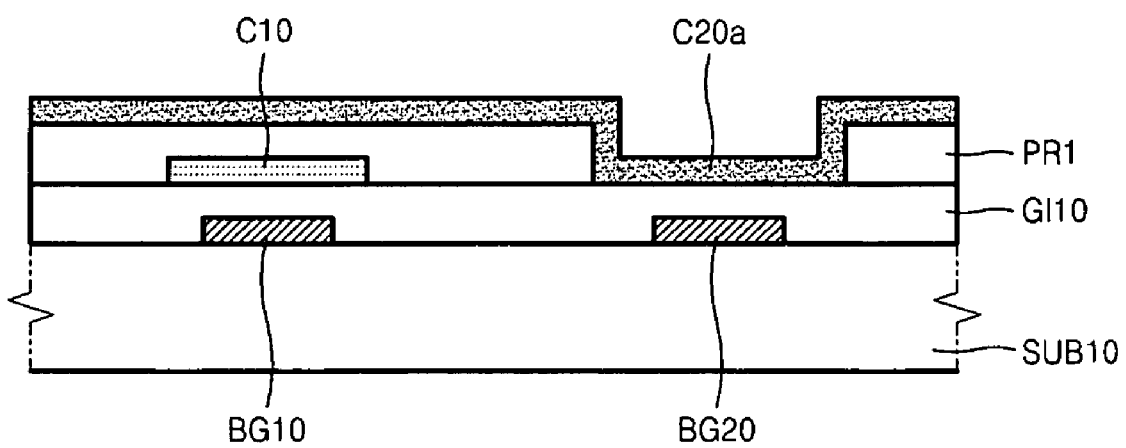
FIG. 21 is a cross-sectional view illustrating a method of fabricating a semiconductor device according to example embodiments.

However, even when the material forming the p-type oxide channel layer and the material forming the n-type oxide channel layer do not have etch selectivity, the structure shown in FIG. 20B may be obtained by using a lift-off process. For example, as shown in FIG. 21, the first oxide channel layer C10 is disposed on the gate insulating layer GI10, a photoresist layer PR1, which covers the first oxide channel layer C10 and has an opening which exposes a region where a second oxide channel layer may be formed, is formed, and further, the second oxide channel material layer C20a may be formed on the photoresist layer PR1 and the region where the second oxide channel layer may be formed. Also, the photoresist layer PR1 and the second oxide channel material layer C20a thereon may be removed and the second oxide channel material layer C20a remains only on the second oxide channel layer forming region. Accordingly, the structure shown in FIG. 20B may be obtained.

Figure 22A:
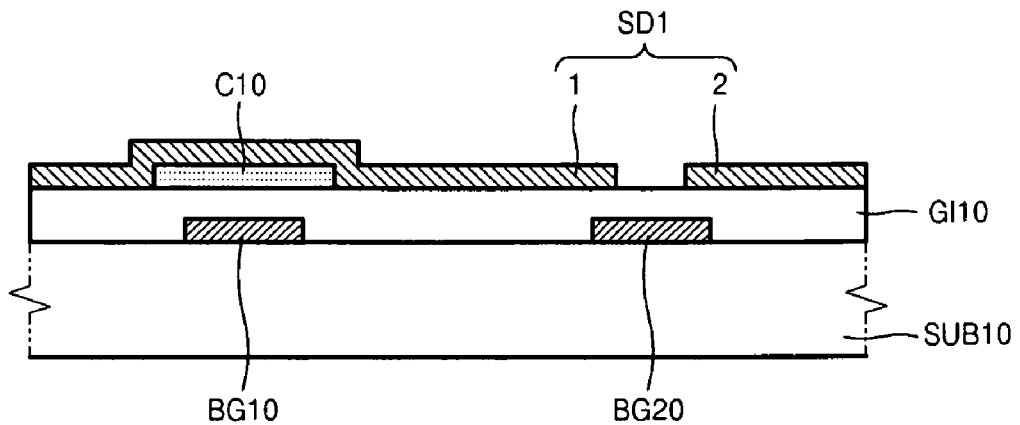
FIGS. 22A through 22C are cross-sectional views illustrating a method of fabricating a semiconductor device according to example embodiments.
Figure 22B:
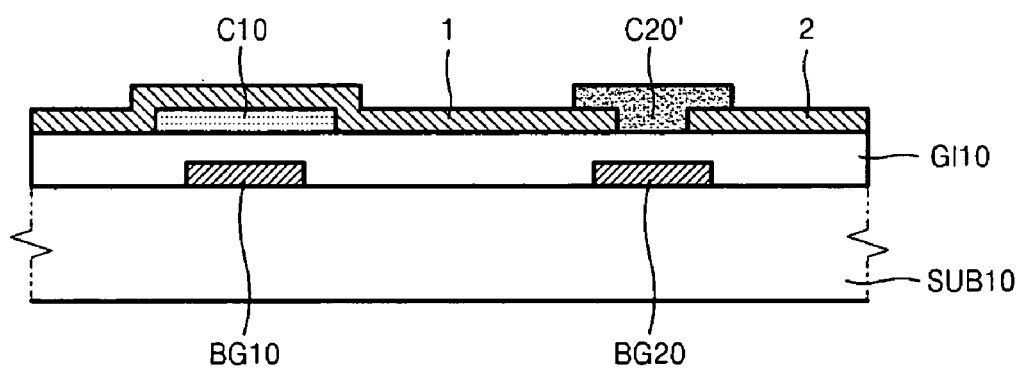
Figure 22C:
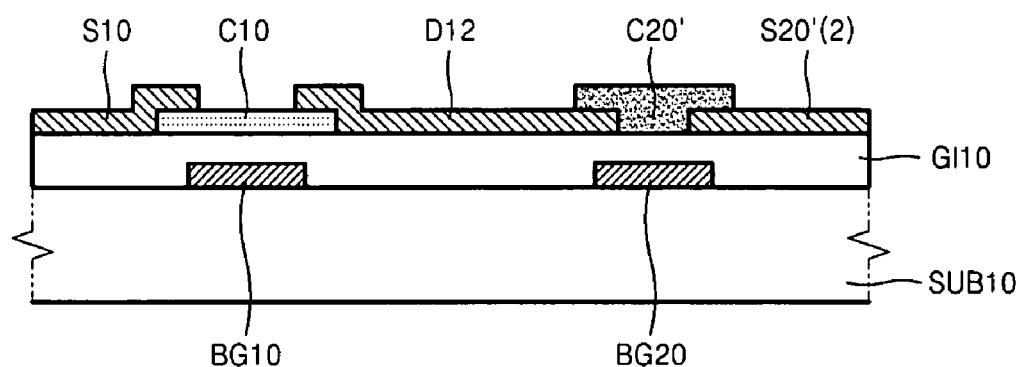

FIGS. 22A through 22C are cross-sectional views illustrating a method of fabricating a semiconductor device according to example embodiments.

Referring to FIG. 22A, somewhat similarly to the method illustrated in FIG. 20A, the first and second bottom gates BG10 and BG20, the gate insulating layer GI10, and the first oxide channel layer C10 of the first conductive type may be formed on the substrate SUB10. Also, a source/drain electrode layer SD1 may be formed on the gate insulating layer GI10. The source/drain electrode layer SD1 may include a first layer 1 and a second layer 2 which are separated from each other. The first layer 1 may extend to an upper portion of a first end of the second bottom gate BG20 while covering the first oxide channel layer C10. The second layer 2 may extend from the upper portion of a second end of the second bottom gate BG20 outward of the second bottom gate BG20.

Referring to FIG. 22B, a second oxide channel layer C20' of a second conductive type which contacts the first and second layers 1 and 2 may be formed on the gate insulating layer GI10 above the second bottom gate BG20. When forming the second oxide channel layer C20', the first oxide channel layer C10 is covered with the first layer 1. Therefore, the fabrication method of the present embodiment may be applied when the material forming the first oxide channel layer C10 and the material forming the second oxide channel layer C20' do not have etch selectivity.

Referring to FIG. 22C, the first layer 1 is patterned to form the first source electrode S10 and the common drain electrode D12 which respectively contact both ends of the first oxide channel layer C10. The second layer 2 may become the second source electrode S20'. Although it is not shown in the drawings, the passivation layer which covers the first and second oxide channel layers C10 and C20', the first and second source electrodes S10 and S20', and the common drain electrode D12 may be formed on the gate insulating layer GI10. The substrate on which the above layers are formed may be annealed at a given temperature. The semiconductor device fabricated by the method of example embodiments is shown, for example, in FIG. 11.

When the material forming the p-type oxide channel layer and the material forming the n-type oxide channel layer do not have etch selectivity, the semiconductor devices illustrated in FIGS. 12, and 15 through 17 may be fabricated by a method somewhat similar to the method illustrated in FIGS. 22A through 22C.

Figure 23A:
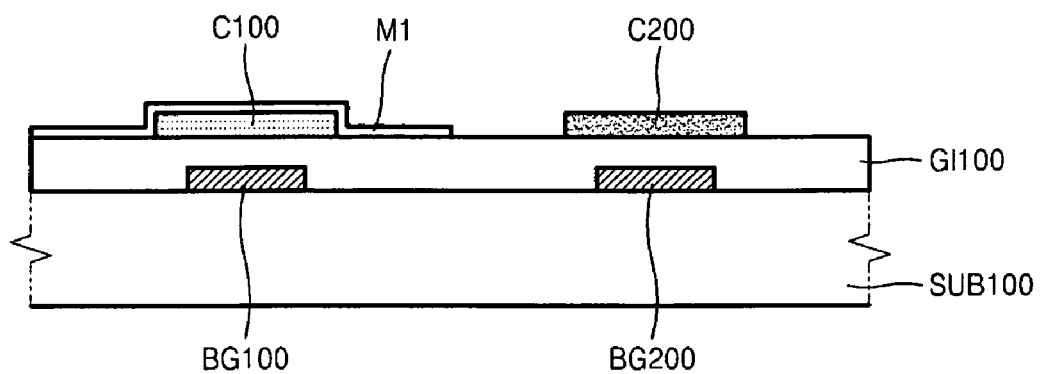
FIGS. 23A through 23C are cross-sectional views illustrating a method of fabricating a semiconductor device according to example embodiments.
Figure 23B:
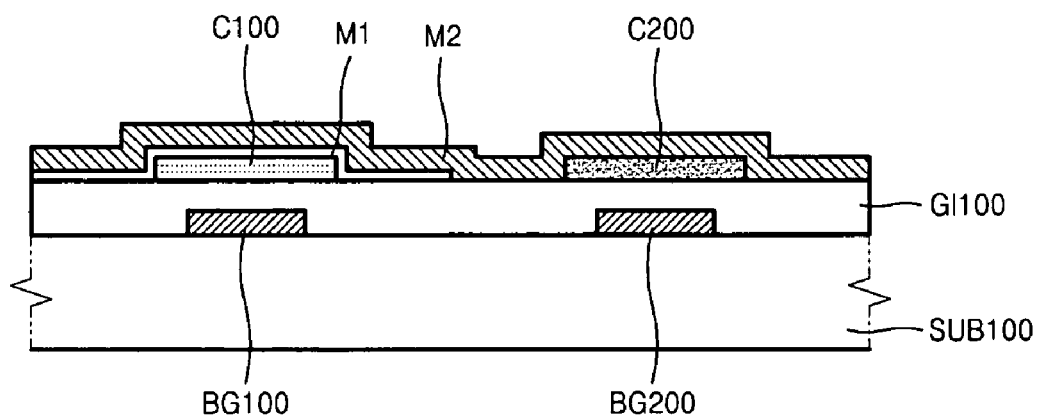
Figure 23C:
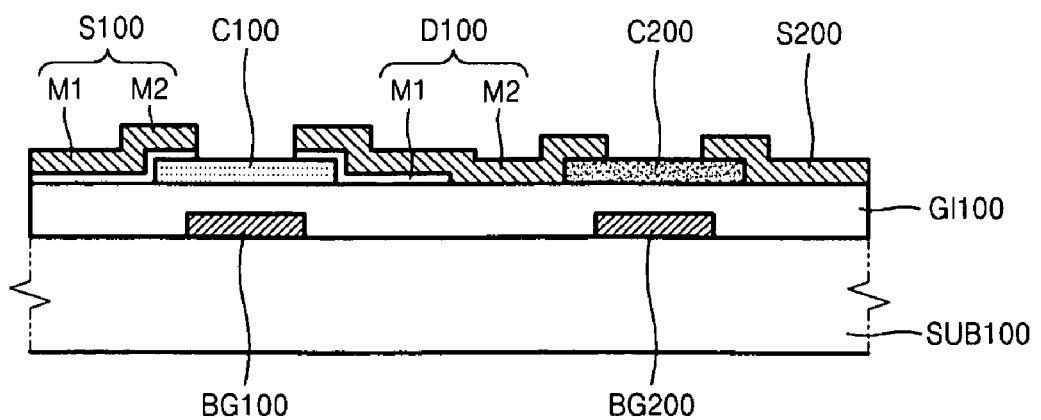

FIGS. 23A through 23C are cross-sectional views illustrating a method of fabricating a semiconductor device according to example embodiments.

Referring to FIG. 23A, the first and second bottom gates BG100 and BG200 may be formed on the substrate SUB100, and the gate insulating layer GI100 which covers the first and second bottom gates BG100 and BG200 may be formed. The first and second oxide channel layer C100 and C200 may be formed on the gate insulating layer GI100. The first and second oxide channel layers C100 and C200 may correspond to the first and second oxide channel layers C10 and C20 illustrated in FIG. 1, and may be formed above the first and second bottom gates BG100 and BG200. The first material layer M1 which covers the first oxide channel layer C100 may be formed on the gate insulating layer GI100.

Referring to FIG. 23B, the second material layer M2 which covers the first material layer M1 and the second oxide channel layer C200 may be formed on the gate insulating layer GI100.

As shown in FIG. 23C, the first source electrode S100, the common drain electrode D100, and the second source electrode S200 may be formed by patterning the second material layer M2 and the first material layer M1. Structures of the first source electrode S100, the common drain electrode D100, and the second source electrode S200 may be somewhat similar to those of FIG. 18. In FIG. 23B, the second material layer M2 and the first material layer M1 may be patterned together by using an etching process, or may be patterned separately by using separate etching processes.

FIGS. 24A through 24D are cross-sectional views illustrating a method of fabricating a semiconductor device according to example embodiments.

Figure 24A:
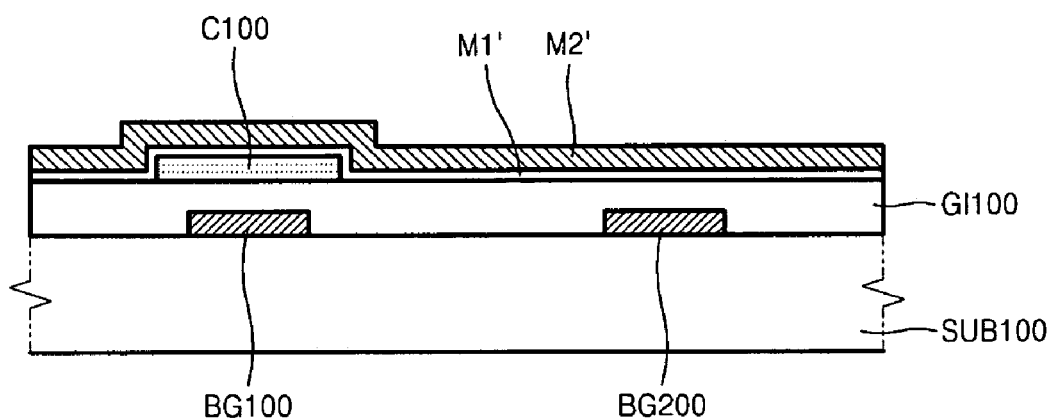
FIGS. 24A through 24D are cross-sectional views illustrating a method of fabricating a semiconductor device according to example embodiments.

Referring to FIG. 24A, the first and second bottom gates BG100 and BG200 and the gate insulating layer GI100 may be formed on the substrate SUB100. The first oxide channel layer C100 may be formed on the gate insulating layer GI100 located above the first bottom gate BG100. The first material layer M1' which covers the first oxide channel layer C100 may be formed on the gate insulating layer GI100, and the second material layer M2' may be formed on the first material layer M1'.

Figure 24B:
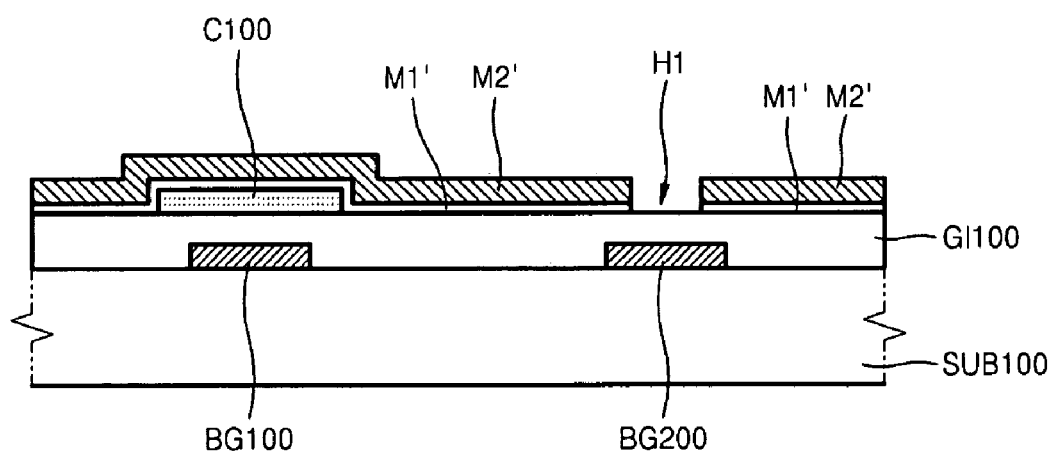

The second material layer M2' and the first material layer M1' may be firstly patterned, for example, so as to form a first opening H1 above the second bottom gate BG200 as shown in FIG. 24B. For instance, the stacked structure of the first and second material layers M1' and M2' may be divided into two parts on both sides of the second bottom gate BG200 due to the above patterning operation.

Figure 24C:
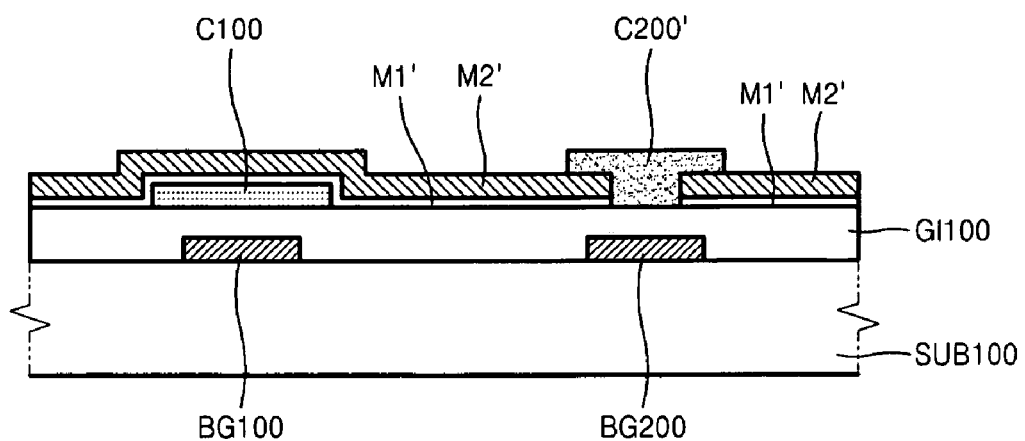

Referring to FIG. 24C, the second oxide channel layer C200' may be formed on the gate insulating layer GI100 located above the second bottom gate BG200. Lower surfaces of both ends of the second oxide channel layer C200' may contact the second material layer M2'.

Figure 24D:
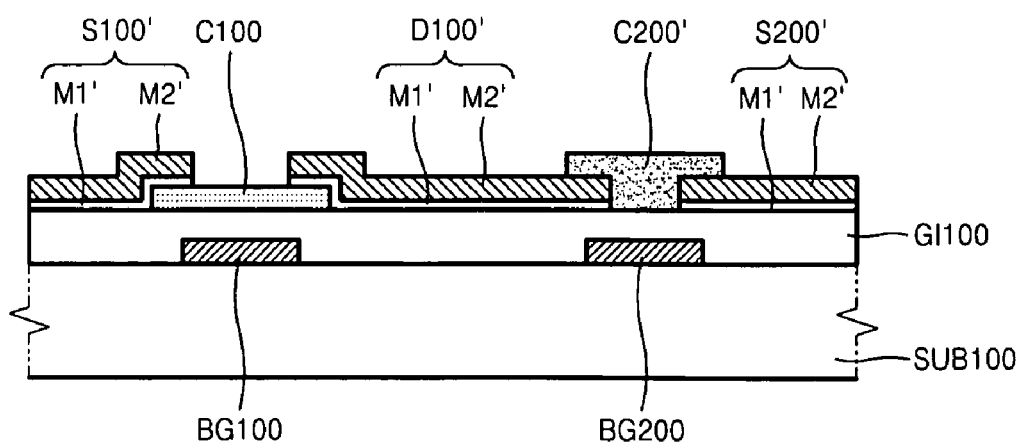

The second material layer M2' and the first material layer M1' may be patterned again so as to form the first source electrode S100' and the common drain electrode D100' which contact both ends of the first oxide channel layer C100 as shown in FIG. 24D. The second material layer M2' of the common drain electrode D100' may contact the lower surface of an end of the second oxide channel layer C200'. The second material layer M2' which contacts a lower surface of another end of the second oxide channel layer C200' and the first material layer M1' under the second material layer M2' may form the second source electrode S200'. Although it is not shown in the drawings, the passivation layer may be further formed on the first and second oxide channel layers C100 and C200' and the second material layer M2. Accordingly, the substrate on which the above layers are formed may be annealed at a given temperature.

The fabrication method illustrated in FIGS. 24A through 24D may be applied when the material forming the first oxide channel layer C100 and the material forming the second oxide channel layer C200' do not have etch selectivity.

The semiconductor devices according to example embodiments of the present invention may be applied as a basic element in various circuits. For example, the semiconductor device of the embodiments of the present invention may be applied to an inverter, and may be used as a basic element in various logic circuits such as a NAND device, a NOR device, an encoder, a decoder, a multiplexer (MUX), a demultiplexer (DEMUX), or a sense amplifier. Furthermore, the inverter or the logic circuits including the semiconductor device of the embodiments may be applied to various fields such as liquid crystal displays (LCDs), organic electroluminescence (EL) devices, and memory devices. Also, the transistor included in the semiconductor device according to example embodiments is the oxide TFT, and thus, may be fabricated by using a low temperature process and may have excellent mobility. For example, the inverter and the logic circuits including the semiconductor devices of the embodiments of the present invention may be applied as a peripheral device of a three-dimensional stacked memory which may be formed at a low temperature, such as a 1 diode (1D)-1 resistor (1R) multi-layer cross point memory device.

Hereinafter, a NAND device and a NOR device including the semiconductor device according to example embodiments will be described.

Figure 25:
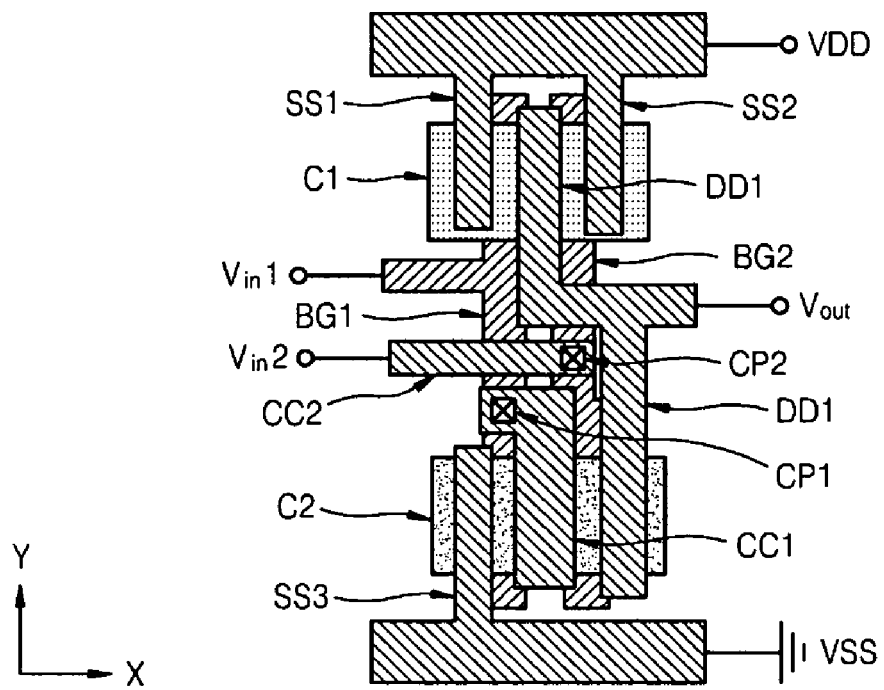
FIGS. 25 through 27 are plan views of a NAND device according to example embodiments.
Figure 26:
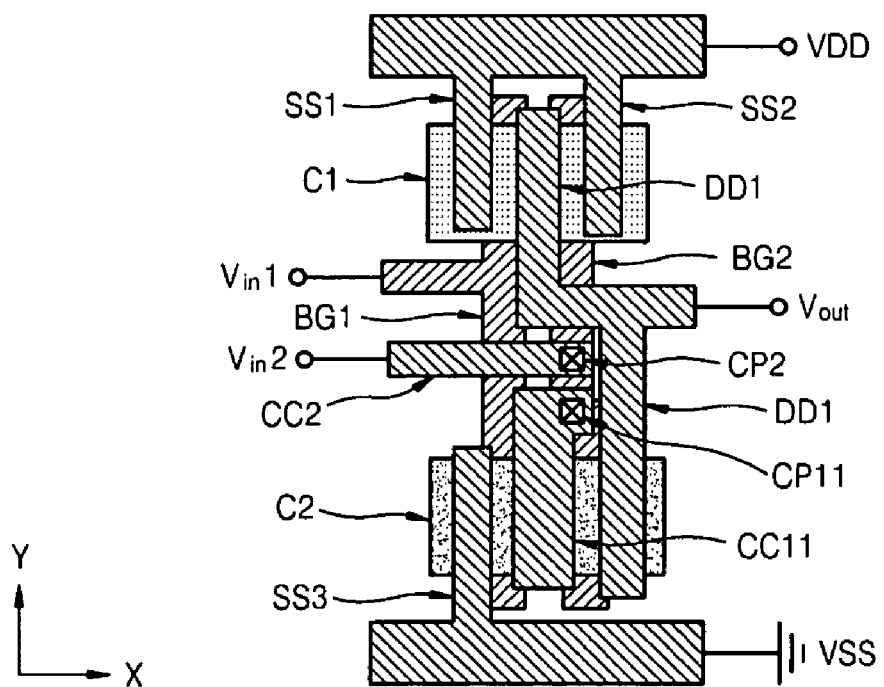
Figure 27:
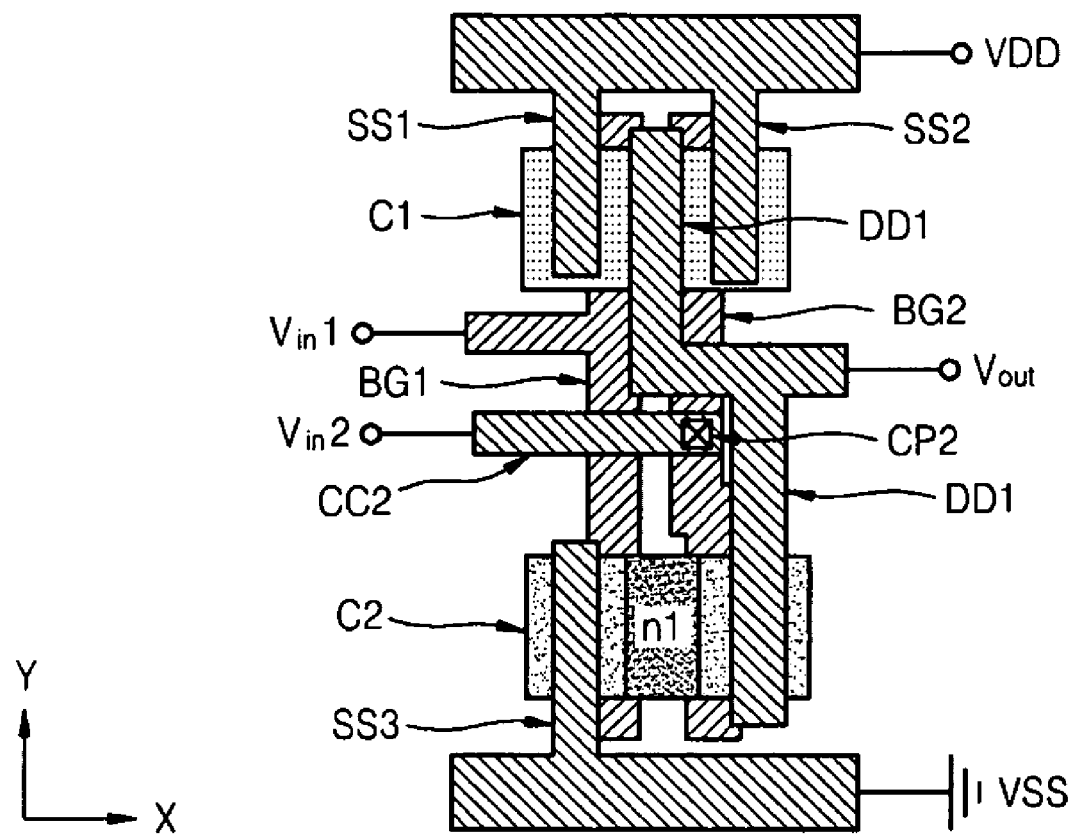

FIGS. 25 through 27 are plan views of the NAND devices according to example embodiments. The NAND device may include two p-type oxide TFTs and two n-type oxide TFTs. The two p-type oxide TFTs may be connected in parallel, and may have a common drain electrode. The two n-type oxide TFTs may be connected to the common drain electrode in series.

Referring to FIG. 24, first and second bottom gates BG1 and BG2 extending in a Y-axis direction may be formed. A gate insulating layer (not shown) which covers the first and second bottom gates BG1 and BG2 may be formed. First and second oxide channel layers C1 and C2 may be disposed on the gate insulating layer. One of the first and second oxide channel layers C1 and C2, for example, the first oxide channel layer C1, may be a p-type, and the other, for example, the second oxide channel layer C2, may be an n-type. Materials forming the first and second oxide channel layers C1 and C2 may be the same as those of the first and second oxide channel layers C10 and C20 of FIG. 1. The first and second oxide channel layers C1 and C2 may be separated from each other to cross the first and second bottom gates BG1 and BG2. For example, first and second source electrodes SS1 and SS2 which contact both ends of the first oxide channel layer C1 may be formed, and a common drain electrode DD1 which contacts a center portion of the first oxide channel layer C1 may be formed. The first and second source electrodes SS1 and SS2 may be connected to each other, and the common drain electrode DD2 may extend to contact an end of the second oxide channel layer C2. A third source electrode SS3 may contact the other end of the second oxide channel layer C2. A first connection wire CC1 may contact a center portion of the second oxide channel layer C2. The first connection wire CC1 may be connected to the first bottom gate BG1 via a first contact plug CP1. A second connection wire CC2 may contact the second bottom gate BG2 at the same height as that of the first connection wire CC1. The second connection wire CC2 and the second bottom gate BG2 may be connected to each other via a second contact plug CP2.

The first bottom gate BG1 may be connected to a first input terminal Vin1, and the second connection wire CC2 may be connected to a second input terminal Vin2. The first and second source electrodes SS1 and SS2 may be connected to a power terminal VDD, and the common drain electrode DD1 may be connected to an output terminal Vout. The third source electrode SS3 may be connected to a ground terminal VSS. The first connection wire CC1 may apply a gate voltage input through the first input terminal Vin1 to the center portion of the second oxide channel layer C2 to reduce a resistance of the second oxide channel layer C2. Accordingly, operating characteristics of the NAND device may be improved by the first connection wire CC1.

The first connection wire CC1 may be connected to the second bottom gate BG2, instead of to the first bottom gate BG1, an example of which is shown in FIG. 26.

Referring to FIG. 26, a first connection wire CC11 is connected to the second bottom gate BG2 via a first contact plug CP11. Other configurations apart from the above-described element may be the same as those of FIG. 25. The first connection wire CC11 may apply a gate voltage applied to the second input terminal Vin2 to the center portion of the second oxide channel layer C2 to reduce the resistance of the second oxide channel layer C2.

In FIGS. 25 and 26, the resistance on the center portion of the second oxide channel layer C2 is reduced by using the first connection wire CC1 or CC11. However, the resistance may be reduced by using other methods. For example, as shown in FIG. 27, an n+ region (n1) may be formed in the center portion of the second oxide channel layer C2 to reduce the resistance without using the first connection wire CC1 or CC11.

Figure 28:
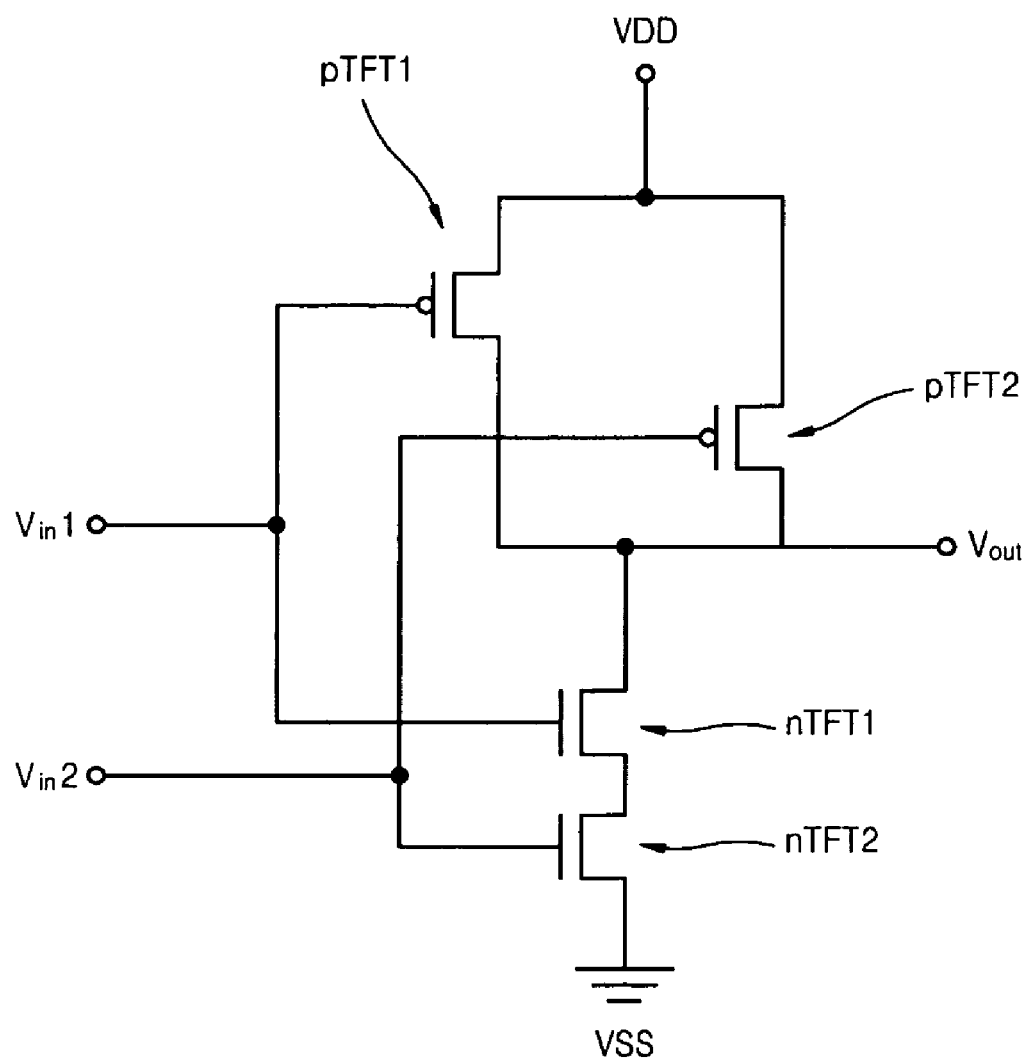
FIG. 28 is a circuit diagram of the NAND device illustrated in FIGS. 25 through 27.

FIG. 28 is a circuit diagram of the NAND device shown in FIGS. 25 through 27.

Referring to FIG. 28, two p-type oxide TFTs pTFT1 and pTFT2 may be connected in parallel, and two n-type oxide TFTs nTFT1 and nTFT2 may be connected to the common drain of the two p-type oxide TFTs pTFT1 and pTFT2 in series. The connection relations between components of the NAND device and the terminals VDD, Vin, Vout, VSS may be the same as those of FIG. 25.

Figure 29:
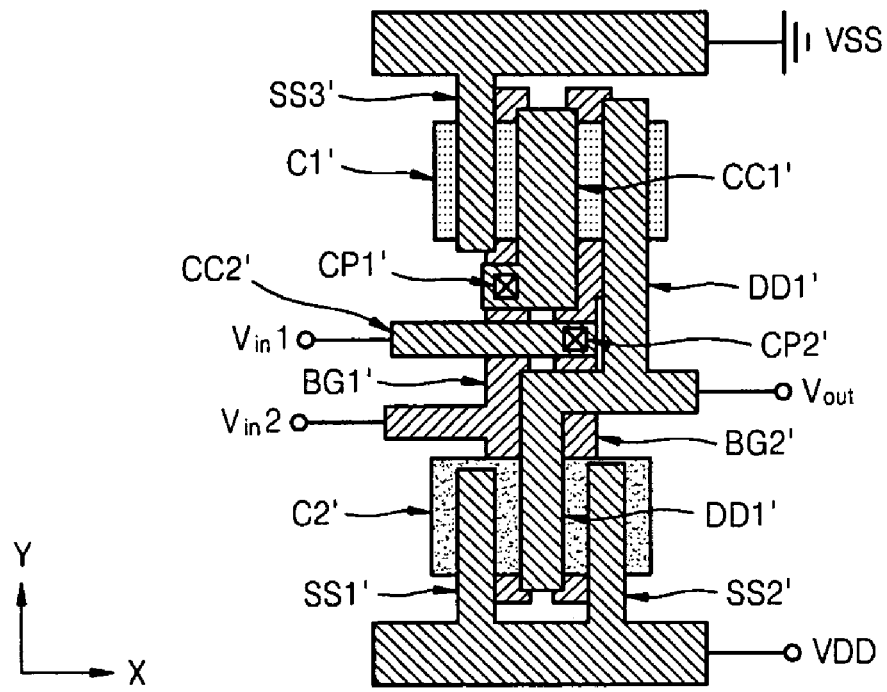
FIGS. 29 through 31 are plan views of a NOR device according to example embodiments.
Figure 30:
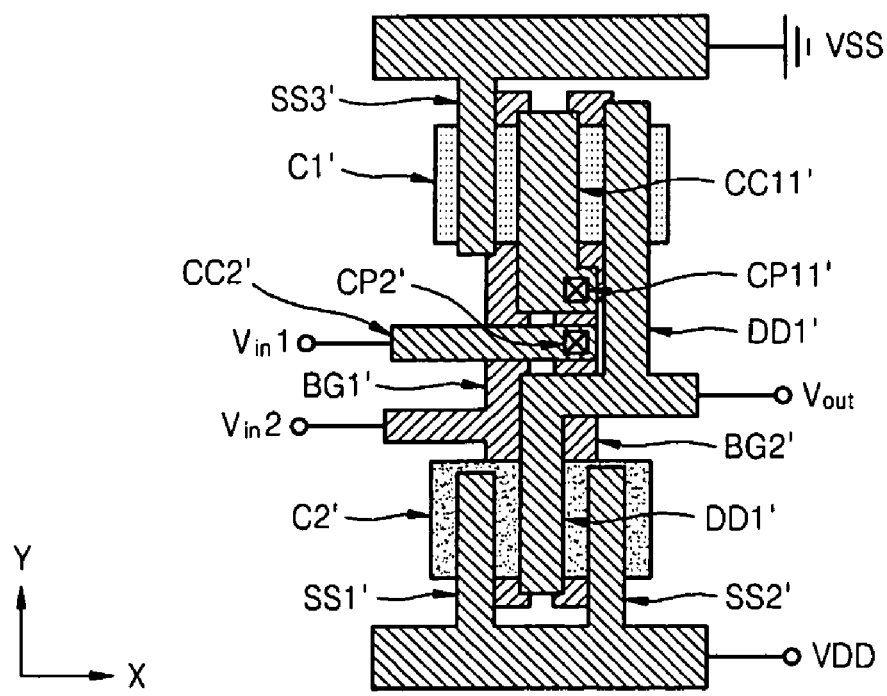
Figure 31:
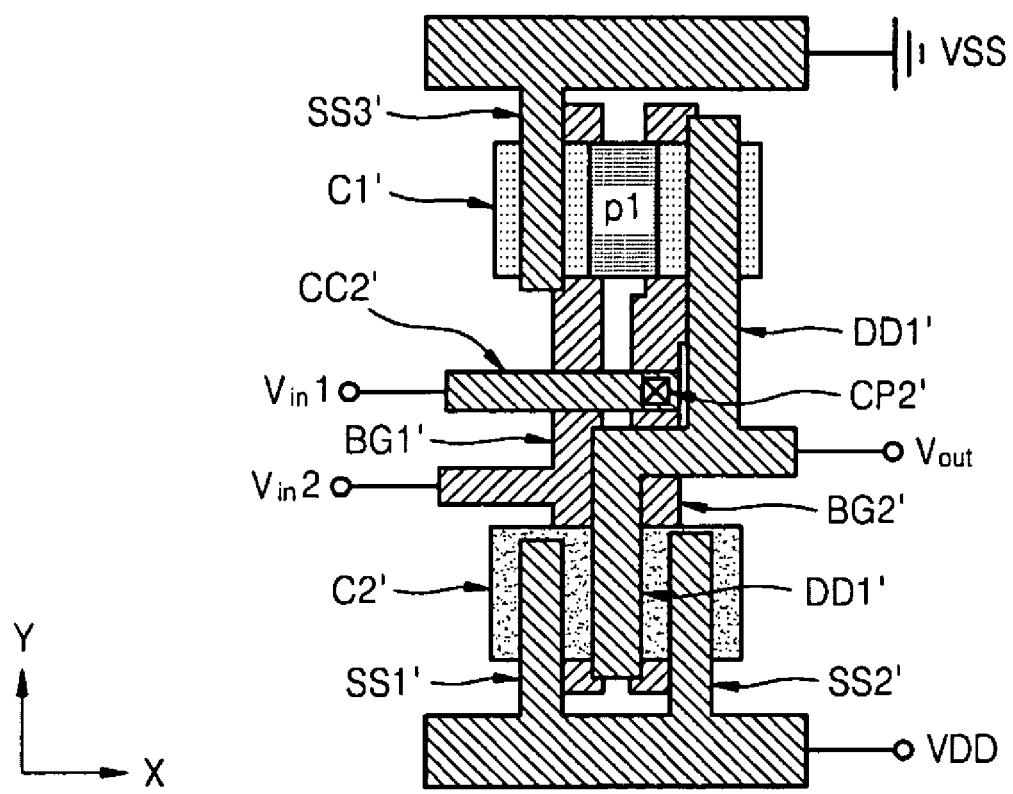

FIGS. 29 through 31 are plan views of NOR devices according to example embodiments. Each of the NOR devices of the present embodiments may include two p-type oxide TFTs and two n-type oxide TFTs. The two n-type oxide TFTs may be connected in parallel, and may have a common drain electrode. The two p-type oxide TFTs may be connected to the common drain electrode in series.

Referring to FIG. 29, first and second bottom gates BG1' and BG2' extending in a Y-axis direction may be formed. A gate insulating layer (not shown) which covers the first and second bottom gates BG1' and BG2' may be formed. First and second oxide channel layers C1' and C2' may be disposed on the gate insulating layer. One of the first and second oxide channel layers C1' and C2', for example, the first oxide channel layer C1', may be a p-type, and the other, for example, the second oxide channel layer C2', may be an n-type. Materials forming the first and second oxide channel layers C1' and C2' may be the same as those of the first and second oxide channel layers C10 and C20 of FIG. 1. The first and second oxide channel layers C1' and C2' may be separated from each other to cross the first and second bottom gates BG1' and BG2'. First and second source electrodes SS1' and SS2' which contact both ends of the second oxide channel layer C2' may be formed, and a common drain electrode DD1' which contacts a center portion of the second oxide channel layer C2' may be formed. The first and second source electrodes SS1' and SS2' may be connected to each other, and the common drain electrode DD1' may extend to contact an end of the first oxide channel layer C1'. A third source electrode SS3' may contact another end of the first oxide channel layer C1. A first connection wire CC1' may contact a center portion of the first oxide channel layer C1'. The first connection wire CC1' may be connected to the first bottom gate BG1' via a first contact plug CP1'. A second connection wire CC2' may contact the second bottom gate BG2' at the same height as that of the first connection wire CC1'. The second connection wire CC2' and the second bottom gate BG2' may be connected to each other via a second contact plug CP2'.

The first bottom gate BG1' may be connected to a second input terminal Vin2, and the second connection wire CC2' may be connected to a first input terminal Vin1. The first and second source electrodes SS1' and SS2' may be connected to a power terminal VDD, and the common drain electrode DD1' may be connected to an output terminal Vout. The third source electrode SS3' may be connected to a ground terminal VSS. The first connection wire CC1' may apply a gate voltage input through the second input terminal Vin2 to the center portion of the first oxide channel layer C1' to reduce a resistance of the first oxide channel layer C1'. Accordingly, operating characteristics of the NOR device may be improved by the first connection wire CC1'.

The first connection wire CC1' may be connected to the second bottom gate BG2', instead of to the first bottom gate BG1' as shown in FIG. 30.

Referring to FIG. 30, a first connection wire CC11' is connected to the second bottom gate BG2' via a first contact plug CP11'. Other configurations except for the above element may be the same as those of FIG. 29. For example, the first connection wire CC11' may apply a gate voltage applied to the first input terminal Vin1 to the center portion of the first oxide channel layer C1' to reduce the resistance of the first oxide channel layer C1'.

In FIGS. 29 and 30, the resistance on the center portion of the first oxide channel layer C1' is reduced by using the first connection wire CC1' or CC11'. However, the resistance may be reduced by using other methods. For example, as shown in FIG. 31, a p+ region (p1) is formed in the center portion of the first oxide channel layer C1' to reduce the resistance without using the first connection wire CC1' or CC11'.

Figure 32:
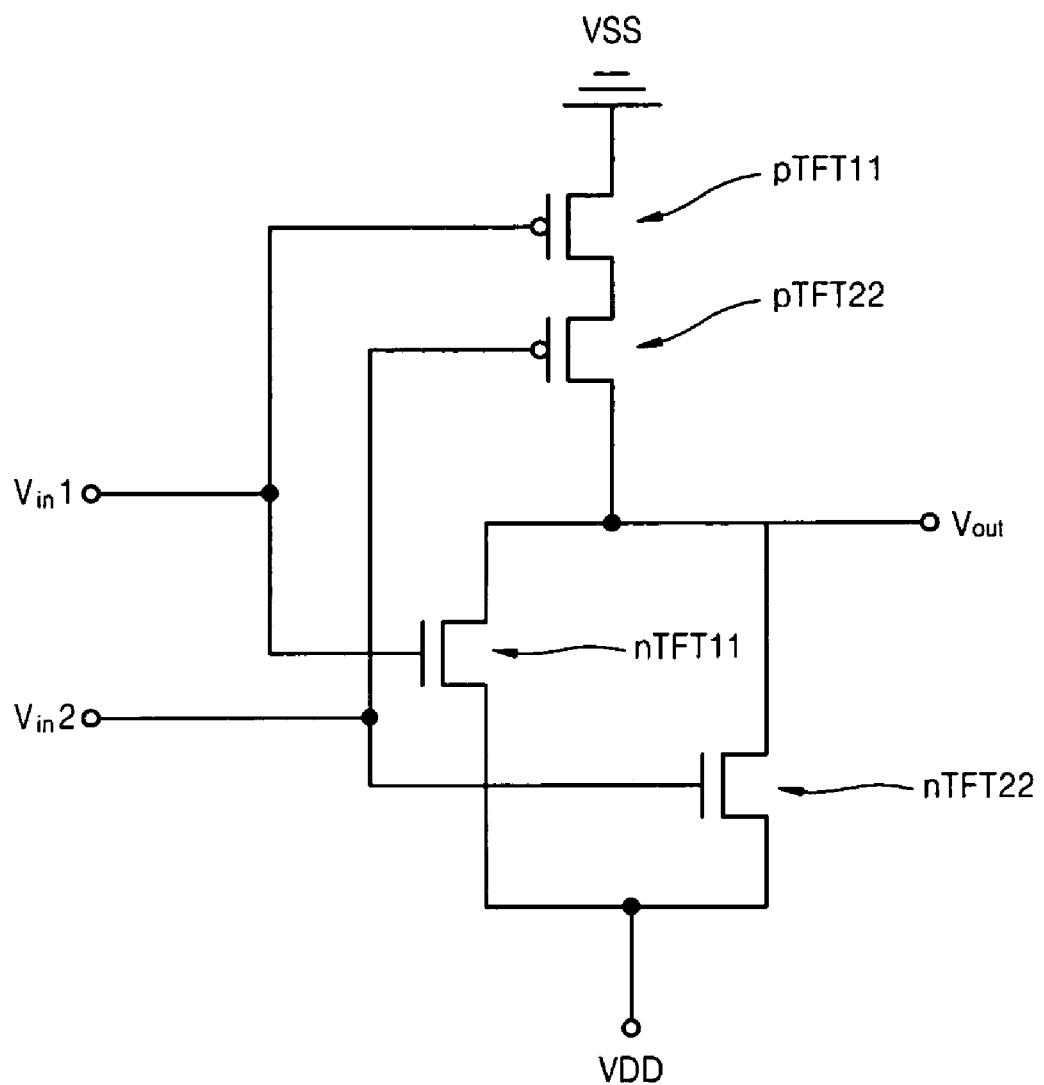
FIG. 32 is a circuit diagram of the NOR device illustrated in FIGS. 29 through 31.

FIG. 32 is a circuit diagram of the NOR devices shown in FIGS. 29 through 31.

Referring to FIG. 32, two n-type oxide TFTs nTFT11 and nTFT22 may be connected in parallel, and two p-type oxide TFTs pTFT11 and pTFT22 may be connected to the common drain of the two n-type oxide TFTs nTFT11 and nTFT22 in series. The connections between components of the NOR device and the terminals VDD, Vin, Vout, VSS may be the same as those of FIG. 29.

FIGS. 25 through 27 and FIGS. 29 through 31 show the NAND device and the NOR device having the transistors with bottom gate structures. However, the NAND device and the NOR device may include the transistors having the top gate structures or the dual gate structures.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A semiconductor device, comprising:
a first thin film transistor (TFT) including a first source, a first drain, a first channel layer, and a first gate; and
a second TFT including a second source, a second drain, a second channel layer, and a second gate;
wherein one of the first and second channel layers is a p-type oxide layer,
wherein the other of the first and second channel layers is an n-type oxide layer,
wherein the first source and the first drain contact at least one of upper surfaces and lower surfaces at end portions of the first channel layer, and
wherein the second source and the second drain contact at least one of upper surfaces and lower surfaces at end portions of the second channel layer.

2. The semiconductor device of claim 1, wherein the first and second TFTs have at least one of a bottom gate structure and a top gate structure.

3. The semiconductor device of claim 1, wherein one of the first and second TFTs has a bottom gate structure, and
wherein another of the first and second TFTs has a top gate structure.

4. The semiconductor device of claim 1, wherein at least one of the first and second TFTs further includes a dual gate structure having an additional gate.

5. A semiconductor device, comprising:
a first thin film transistor (TFT) including a first source, a first drain, a first channel layer, and a first gate; and
a second TFT including a second source, a second drain, a second channel layer, and a second gate;
wherein one of the first and second channel layers is a p-type oxide layer,
wherein the other of the first and second channel layers is an n-type oxide layer,
wherein the first source and the first drain include a first material layer contacting end portions of the first channel layer,
wherein the second source and the second drain include a second material layer contacting end portions of the second channel layer, and
wherein the first and second material layers are different.

6. The semiconductor device of claim 5, wherein the first material layer contacts upper surfaces at the end portions of the first channel layer, and wherein the second material layer contacts one of upper surfaces and lower surfaces at the end portions of the second channel layer.

7. The semiconductor device of claim 5, wherein the first source and the first drain have dual-layered structures, and wherein the second source and the second drain have one of single-layered structures and dual-layered structures.

8. The semiconductor device of claim 1, wherein the first drain contacts the second drain to form a common drain.

9. The semiconductor device of claim 1, wherein the semiconductor device is one of an inverter, a NAND device, a NOR device, an encoder, a decoder, a multiplexer (MUX), a demultiplexer (DEMUX), and a sense amplifier.

10. The semiconductor device of claim 5, wherein the first and second TFTs have at least one of a bottom gate structure and a top gate structure.

11. The semiconductor device of claim 5, wherein one of the first and second TFTs has a bottom gate structure, and wherein another of the first and second TFTs has a top gate structure.

12. The semiconductor device of claim 5, wherein at least one of the first and second TFTs further includes a dual gate structure having an additional gate.

13. The semiconductor device of claim 5, wherein the first drain contacts the second drain to form a common drain.

14. The semiconductor device of claim 5, wherein the semiconductor device is one of an inverter, a NAND device, a NOR device, an encoder, a decoder, a multiplexer (MUX), a demultiplexer (DEMUX), and a sense amplifier.

15. A semiconductor device, comprising:
a first thin film transistor (TFT) including a first source, a first drain, a first channel layer, and a first gate; and
a second TFT including a second source, a second drain, a second channel layer, and a second gate;
wherein one of the first and second channel layers is a p-type oxide layer,
wherein the other of the first and second channel layers is an n-type oxide layer,
wherein the first source and the first drain contact upper surfaces or lower surfaces at both ends of the first channel layer, and
wherein the second source and the second drain contact upper surfaces or lower surfaces at both ends of the second channel layer.

16. The semiconductor device of claim 15, wherein the first and second TFTs have at least one of a bottom gate structure and a top gate structure.

17. The semiconductor device of claim 15, wherein one of the first and second TFTs has a bottom gate structure, and wherein another of the first and second TFTs has a top gate structure.

18. The semiconductor device of claim 15, wherein at least one of the first and second TFTs further includes a dual gate structure having an additional gate.

19. The semiconductor device of claim 15, wherein the first drain contacts the second drain to form a common drain.

20. The semiconductor device of claim 15, wherein the semiconductor device is one of an inverter, a NAND device, a NOR device, an encoder, a decoder, a multiplexer (MUX), a demultiplexer (DEMUX), and a sense amplifier.

21. A semiconductor device, comprising:
a first thin film transistor (TFT) including a first source, a first drain, a first channel layer, and a first gate; and
a second TFT including a second source, a second drain, a second channel layer, and a second gate;
wherein one of the first and second channel layers is a p-type oxide layer,
wherein the other of the first and second channel layers is an n-type oxide layer,
wherein the first source and the first drain include a first material layer that contacts both ends of the first channel layer,
wherein the second source and the second drain include a second material layer that contacts both ends of the second channel layer, and
wherein the first and second material layers are different.

22. The semiconductor device of claim 21, wherein the first and second TFTs have at least one of a bottom gate structure and a top gate structure.

23. The semiconductor device of claim 21, wherein one of the first and second TFTs has a bottom gate structure, and wherein another of the first and second TFTs has a top gate structure.

24. The semiconductor device of claim 21, wherein at least one of the first and second TFTs further includes a dual gate structure having an additional gate.

25. The semiconductor device of claim 21, wherein the first material layer contacts upper surfaces at the both ends of the first channel layer, and
wherein the second material layer contacts one of upper surfaces and lower surfaces at the both ends of the second channel layer.

26. The semiconductor device of claim 21, wherein the first source and the first drain have dual-layered structures, and wherein the second source and the second drain have one of single-layered structures and dual-layered structures.

27. The semiconductor device of claim 21, wherein the first drain contacts the second drain to form a common drain.

28. The semiconductor device of claim 21, wherein the semiconductor device is one of an inverter, a NAND device, a NOR device, an encoder, a decoder, a multiplexer (MUX), a demultiplexer (DEMUX), and a sense amplifier.

* * * * *